US012275328B2

(12) United States Patent
Ropel et al.

(10) Patent No.: US 12,275,328 B2
(45) Date of Patent: Apr. 15, 2025

(54) INTELLIGENT BATTERY SYSTEM

(71) Applicant: Volvo Car Corporation, Gothenburg (SE)

(72) Inventors: Andreas Martin Viktor Ropel, Gothenburg (SE); Ben Peter Lloyd, Gothenburg (SE); Matthias Yannick Philippe Le Saux, Gothenburg (SE); Konstantinos Chatziioannou, Gothenburg (SE); Klas Roland Persson Signell, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 187 days.

(21) Appl. No.: 18/050,513

(22) Filed: Oct. 28, 2022

(65) Prior Publication Data

US 2024/0140257 A1 May 2, 2024

(51) Int. Cl.
*B60L 58/12* (2019.01)
*B60L 58/16* (2019.01)
*B60S 5/00* (2006.01)
*G01R 31/367* (2019.01)
(Continued)

(52) U.S. Cl.
CPC .............. *B60L 58/12* (2019.02); *B60L 58/16* (2019.02); *B60S 5/00* (2013.01); *G01R 31/367* (2019.01);
(Continued)

(58) Field of Classification Search
CPC .... B60L 58/12; B60L 58/16; B60L 2240/545; B60L 2240/547; B60L 2240/549;
(Continued)

(56) References Cited

U.S. PATENT DOCUMENTS

2021/0170885 A1* 6/2021 Slepchenkov ........ B60L 15/007
2021/0316621 A1* 10/2021 Slepchenkov .......... B60L 58/18
(Continued)

OTHER PUBLICATIONS

De Gennaro et al. "A case study to predict the capacity fade of the battery of electrified vehicles in real-world use conditions" Case Studies on Transport Policy, vol. 8, Issue 2, Jun. 2020, pp. 517-534, 18 pages.
(Continued)

*Primary Examiner* — Richard M Camby
(74) *Attorney, Agent, or Firm* — Amin, Turocy & Watson, LLP

(57) ABSTRACT

Various embodiments and approaches are described to minimize degradation of respective modules combined to form a battery pack onboard an electric vehicle (EV). Systems and components are presented to determine a respective operational state of the modules, and based thereon, a first subset of modules can be selected to provision power to various EV components while a second subset of modules can be deselected. Module selection can be based upon a threshold operating condition. A visual representation of the modules and their respective operational state can be presented, in conjunction with one or more alarms and recommended corrective operations. Artificial intelligence methods can be utilized to determine an operational state of a module(s). A module can be scheduled for replacement. Limiting degradation to a first module can minimize degradation of a second module. The various components can be stored in a memory and executed by a processor.

20 Claims, 17 Drawing Sheets

(51) Int. Cl.
  *G01R 31/392* (2019.01)
  *H01M 10/42* (2006.01)
  *H01M 10/48* (2006.01)

(52) U.S. Cl.
  CPC ........ *G01R 31/392* (2019.01); *H01M 10/425* (2013.01); *H01M 10/482* (2013.01); *H01M 10/486* (2013.01); *B60L 2240/545* (2013.01); *B60L 2240/547* (2013.01); *B60L 2240/549* (2013.01); *H01M 2010/4271* (2013.01); *H01M 2010/4278* (2013.01); *H01M 2220/20* (2013.01)

(58) Field of Classification Search
  CPC ....... B60L 3/0046; B60S 5/00; G01R 31/367; G01R 31/392; H01M 10/425; H01M 10/482; H01M 10/486; H01M 2010/4271; H01M 2010/4278; H01M 2220/20; Y02T 10/70
  See application file for complete search history.

(56) References Cited

U.S. PATENT DOCUMENTS

2021/0399554 A1* 12/2021 Sherstyuk ............. H02J 7/0014
2022/0276317 A1*  9/2022 Sudarsan ............. G01R 31/392
2023/0194614 A1*  6/2023 Negoita ............... G01R 31/396

OTHER PUBLICATIONS

U.S. Department of Energy "Batteries for Electric Vehicles" U.S. Department of Energy—Energy Efficiency and Renewable Energy Alternative Fuels Data Center, https://afdc.energy.gov/vehicles/electric_batteries.html, Last Accessed May 3, 2023, 2 pages.

Edge et al. "Lithium ion battery degradation: what you need to know" Physical Chemistry Chemical Physics, Issue 14, 2021, 22 pages.

Okada et al. "Development of Lithium-ion Battery Deterioration Diagnosis Technology" Yokogawa Technical Report English Edition vol. 56 No. 2 (2013), 4 pages.

Unknown "Updated: Electric Car Batter Replacement Costs" Recurrent, https://www.recurrentauto.com/research/costs-ev-battery-replacement, Mar. 26, 2023, 15 pages.

Unknown "How EV Batteries Degrade" Recurrent, https://www.recurrentauto.com/research/how-batteries-degrade, Jul. 10, 2021, 4 pages.

Yang et al. "Predictive modeling of battery degradation and greenhouse gas emissions from U.S. state-level electric vehicle operation" Nature Communications, 2018, 10 pages.

Unknown "State of Health (SOH) Determination" https://www.mpoweruk.com/soh.htm, Last Accessed May 3, 2023, 2 pages.

Kong et al. "State of Health Estimation for Lithium-Ion Batteries" IFAC-PapersOnLine, vol. 51, Issue 18, 2018, pp. 667-671.

Zhang et al. "Evaluation of the State of Health of Lithium-Ion Battery Based on the Temporal Convolution Network" Energy Res., Jun. 27, 2022, 8 pages.

Yang et al. "Fast and Accurate Health Assessment of Lithium-Ion Batteries Based on Typical Voltage Segments" Energy Res., May 23, 2022, 7 pages.

Remmlinger et al., "On-board state-of-health monitoring of lithium-ion batteries using linear parameter-varying models" Abstract: Elsevier; Science Direct. vol. 239, Oct. 1, 2013, pp. 689-695.

* cited by examiner

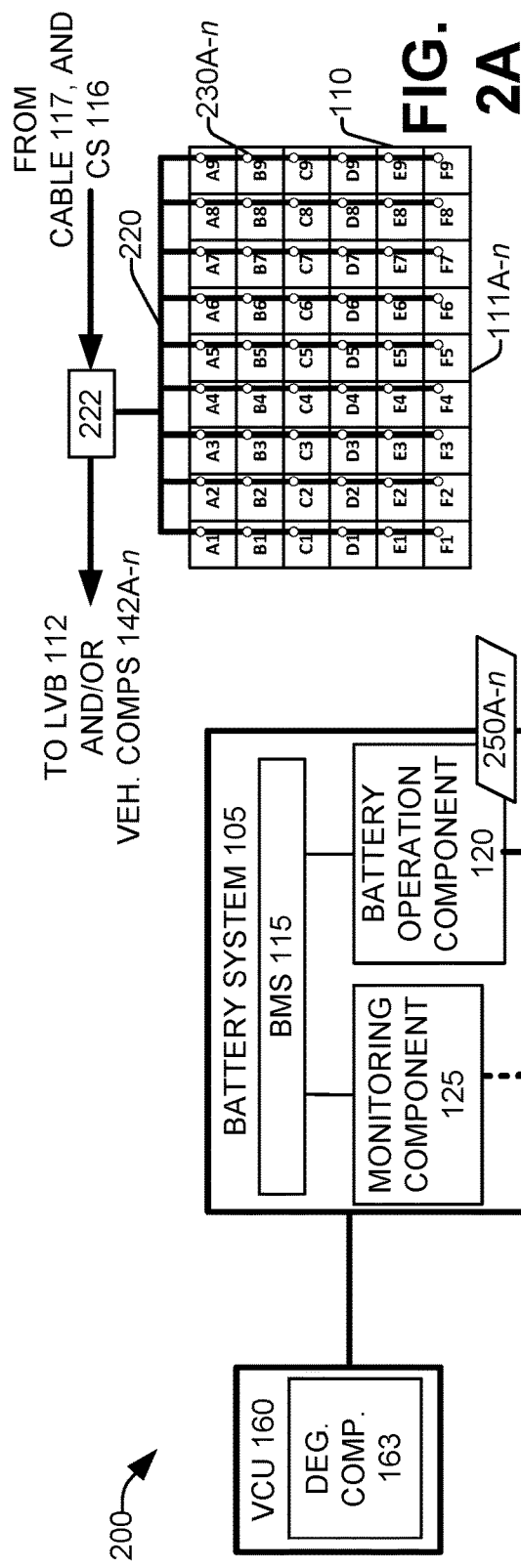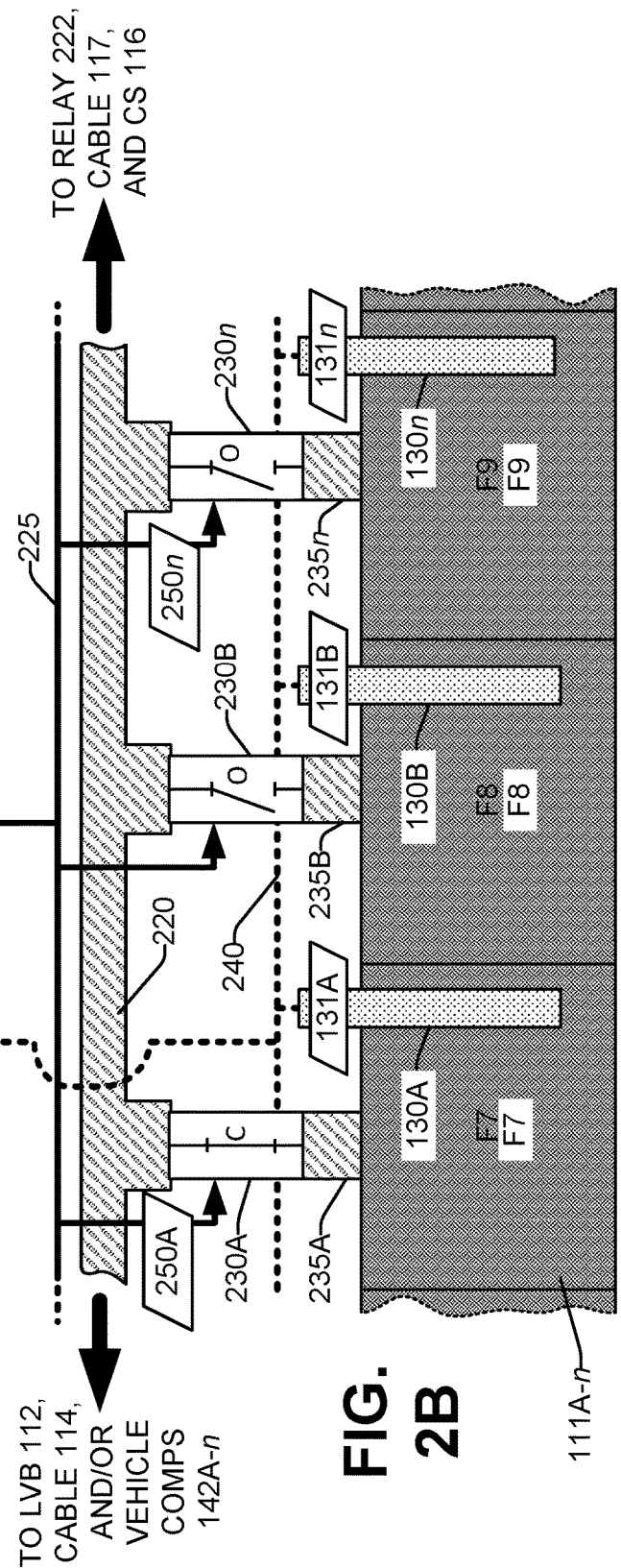

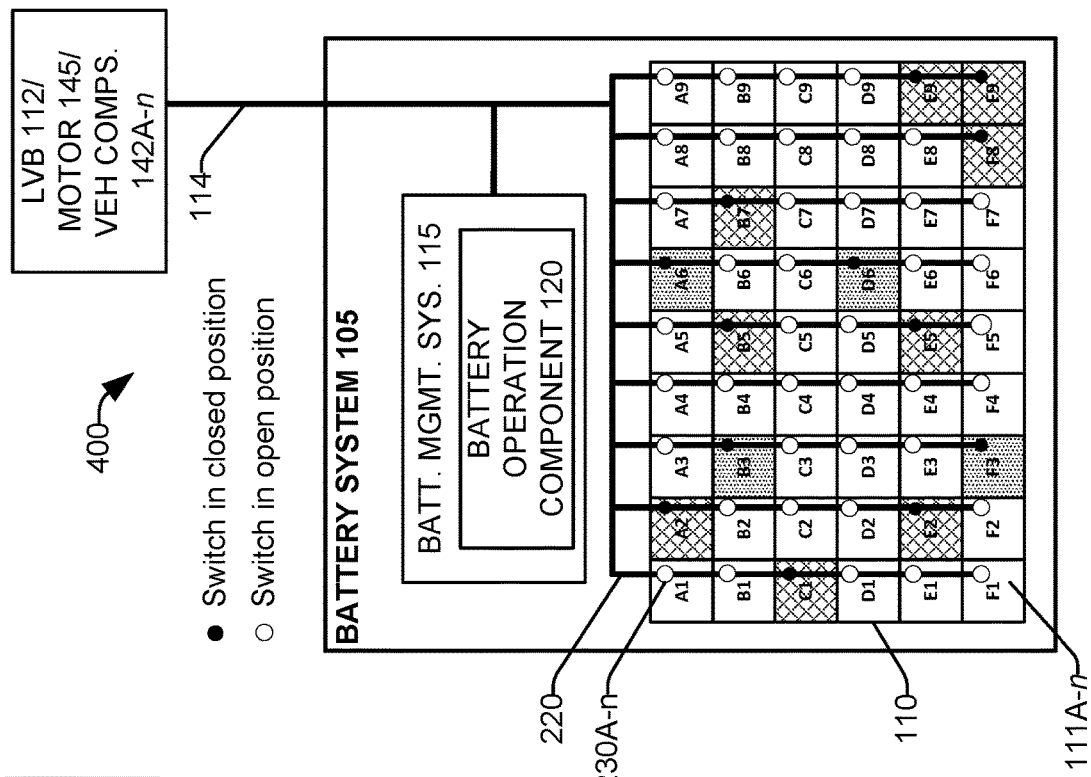
FIG. 3
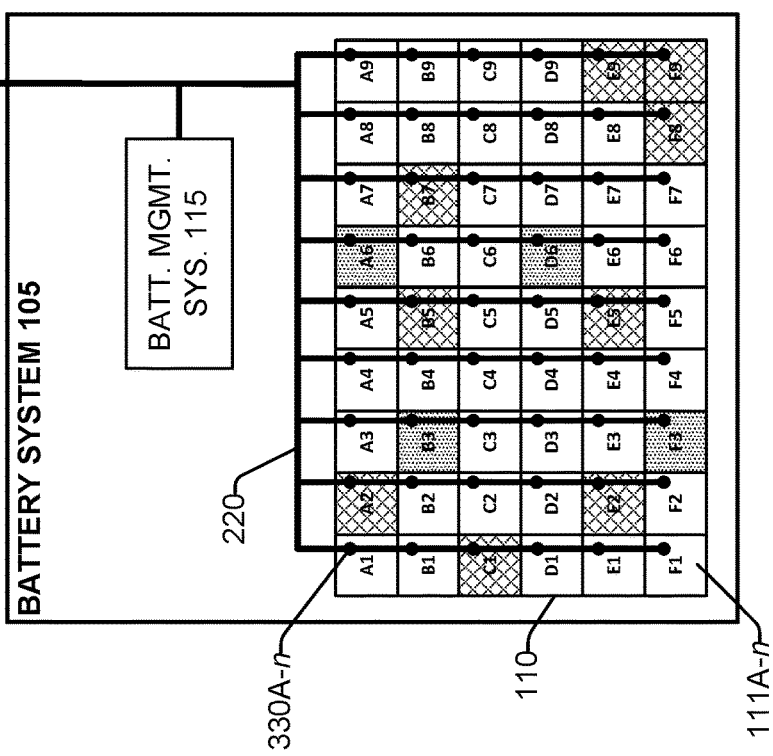
FIG. 4
 Anticipated Degradation
 Moderately Degraded
 Severely Degraded

INTELLIGENT BATTERY SYSTEM

TECHNICAL FIELD

This application relates to techniques facilitating mitigating degradation of a battery located on an electric vehicle.

BACKGROUND

Electric vehicles (EVs) are powered by an electric motor that draws energy from an onboard battery. Chemical energy in the battery is converted to electrical energy, whereby the electrical energy is converted to kinetic energy at the motor. As an EV is driven, motion of the vehicle consumes energy from the battery with an accompanying reduction in the state-of-charge (SOC), state-of-health (SOH), and the like, at the battery.

Rather than being a single-cell component, EVs utilize a battery pack formed from a group of modules electrically connected together, wherein each of the modules comprise a collection of cells. The battery can be recharged at any time, such as while parked for a duration of time (e.g., overnight), at a charging station during a journey, and the like. The charging operation typically entails connection of the EV to a charging station via a charging cable plugged into a charging port on the EV. However, over time, a battery degrades, which can require eventual replacement of the battery. The battery pack can also include a thermal regulation system configured to maintain the modules at a desired operating temperature and a battery management system configured to control operation of the modules.

Operational degradation of a battery is largely described by two terms (a) charge cycle fading (cycle ageing) and (b) calendar ageing. Charge cycle fading is operational degradation of a battery resulting from the respective charging and discharging operations throughout the lifetime of the battery. Calendar ageing is degradation resulting during the operational lifetime of a battery, even where the battery is not in use, and from the environment of use, e.g., resulting from a battery being utilized at an operating temperature above or below an optimal operating temperature. Owing to electrical coupling of the modules, rather than a module degrading in isolation, a degraded module can deleteriously affect the operational health of other modules in the battery pack.

SUMMARY

The following presents a summary to provide a basic understanding of one or more embodiments described herein. This summary is not intended to identify key or critical elements, or delineate any scope of the different embodiments and/or any scope of the claims. The sole purpose of the Summary is to present some concepts in a simplified form as a prelude to the more detailed description presented herein.

In one or more embodiments described herein, systems, devices, computer-implemented methods, methods, apparatus and/or computer program products are presented that facilitate controlling degradation of one or more modules in a battery.

According to one or more embodiments, an EV system comprises a memory that stores computer executable components and a processor that executes the computer executable components stored in the memory. In an embodiment, the computer executable components can further comprise a sensor component configured to generate operational data for a module, wherein the module is electrically coupled to a plurality of modules in a battery pack. In another embodiment, the computer executable components can further comprise an output component configured to transmit the operational data. In a further embodiment, the computer executable components can further comprise a vehicle operation component configured to receive the operational data. In another embodiment, the vehicle operation component can be further configured to, based on the operational data, determine an operating condition of the module.

In other embodiments, elements described in connection with the disclosed systems can be embodied in different forms such as computer-implemented methods, computer program products, or other forms. For example, in an embodiment, a computer-implemented method can be utilized to mitigate degradation of a set of modules in a battery pack located on an EV. In an embodiment, the computer-implemented method can further comprise detecting an operating condition of a module, wherein the module is electrically coupled to at least one other module in a battery pack. In a further embodiment, the computer-implemented method can further comprise transmitting the module operating condition. In a further embodiment, the computer-implemented method can further comprise determining, by a device configured to receive the operating condition, a state of charge of the module.

In another embodiment, a computer program product can comprise a computer readable storage medium having program instructions embodied therewith, the program instructions can be executable by a processor, causing the processor to detect an operating condition of a module, wherein the module is electrically coupled to at least one other module in a battery pack located on an EV. In another embodiment, the program instructions can be further configured to transmit the module operating condition. In another embodiment, the program instructions can be further configured to determine, by a device configured to receive the operating condition, at least one of state of charge of the module, state of health of the module, or depth of discharge of the module.

DESCRIPTION OF THE DRAWINGS

One or more embodiments are described below in the Detailed Description section with reference to the following drawings.

FIG. 2A is a block diagram representation of example components related to preventing degradation of one or more modules combined to form a battery onboard an EV, in accordance with various aspects and implementations of the subject disclosure.

FIG. 2B is a block diagram representation of example components related to preventing degradation of one or more modules combined to form a battery onboard an EV, in accordance with various aspects and implementations of the subject disclosure.

FIG. 3 is a block diagram representation of a current battery system utilized in an EV.

FIG. 4 is a block diagram representation of an example battery system utilized to prevent degradation of one or more battery modules onboard an EV, in accordance with various aspects and implementations of the subject disclosure.

DETAILED DESCRIPTION

Figure 1:
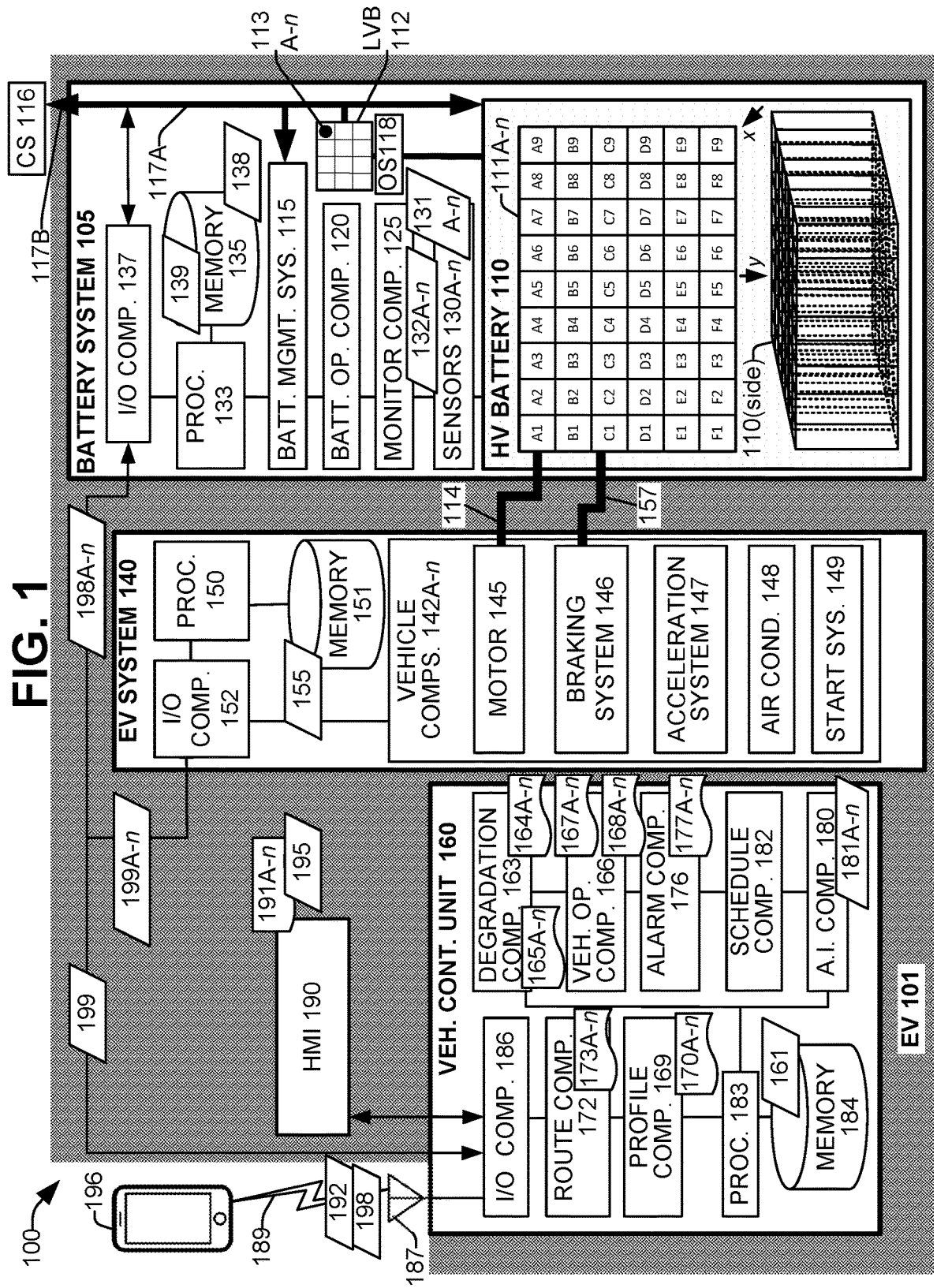
FIG. 1 is a block diagram representation of example components related to preventing degradation of one or more modules combined to form a battery onboard an EV, in accordance with various aspects and implementations of the subject disclosure.

The following detailed description is merely illustrative and is not intended to limit embodiments and/or application or uses of embodiments. Furthermore, there is no intention to be bound by any expressed and/or implied information presented in any of the preceding Background section, Summary section, and/or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

It is to be understood that when an element is referred to as being "coupled" to another element, it can describe one or more different types of coupling including, but not limited to, electrical coupling, chemical coupling, communicative coupling, electromagnetic coupling, operative coupling, optical coupling, physical coupling, thermal coupling, and/or another type of coupling. Likewise, it is to be understood that when an element is referred to as being "connected" to another element, it can describe one or more different types of connecting including, but not limited to, electrical connecting, electromagnetic connecting, operative connecting, optical connecting, physical connecting, thermal connecting, and/or another type of connecting. As used herein, "data" can comprise metadata.

To aid readability and to prevent repetition, the terms "component", "device", "system", "equipment", "element", and the like, are used interchangeably throughout, and as such, where mention is made of a component, it is to be appreciated that any of the terms "device", "system", "equipment", etc. can equally be utilized. Further, the terms "group", "collection", "set", "subset", "variety", "multitude", "multiple", "plethora", "plurality", "compilation", "assemblage", "assembly", "series", and the like, can all be used interchangeably herein.

Throughout the description, various qualifiers are used, such as "poor", "good", "high", "low", "best", "worst", etc. It is to be appreciated that the qualifiers are arbitrary with regard to defining a particular value, measurement, etc. In an example scenario, when considering a range of measurements, the operating condition (e.g., SOH, SOC, and the like) of each module in a collection of modules forming a battery pack can be qualified. The module, or an operating condition of the module, having the lowest value determined from the measurements can be qualified as poor, low, etc., while the module, or an operating condition of the module, having the highest value determined from the measurements can be qualified as good, high, best, etc., wherein the highest value is the value closest to the optimal operating condition of a module, e.g., the optimal operating condition is the condition of the module when installed on the EV (e.g., new condition, battery specification). For example, when determining SOC for a lithium-ion battery, a poor value can be, or substantially close to, 3.0V, while a good value can be, or substantially close to, 4.2V, wherein the 3.0V is a minimum operating voltage and 4.2V is a maximum operating voltage, wherein voltages outside of the 3.0V-4.2V range can cause battery degradation. The specific measurements (and accordingly, what the highest and lowest measurements will be) will depend upon the charge cycle fading and calendar ageing that the specific module has experienced. In another example scenario, the measurements can be a range based about an optimal value, e.g., an optimal operating temperature (e.g., 25° C. (77° F.) for the modules. In this example, the operating temperature of each module can be measured and assessed against the optimal operating temperature, wherein a module having an operating temperature near to optimal (e.g., +10° C./50° F. to +30° C./86° F.) can be qualified as "good", while a module having an operating temperature outside of the "good" range (e.g., outside of the range +10° C./50° F. to +30° C./86° F.) can be qualified as "poor".

Ranges A-n are utilized herein to indicate a respective group of devices, components, signals etc., where n is any positive integer. Furthermore, x herein indicates any value greater than zero.

While one or more devices and/or systems are described below with reference to an EV, such as an automobile, the one or more embodiments described herein are not limited to this use. For example, one or more embodiments presented herein can be utilized to control charging of any battery, wherein the battery may be located on a military vehicle, railroad vehicle, a marine vehicle such as a boat, ship, submarine, or marine drone, a winged vehicle such as a plane or drone, and/or a rotor-ed vehicle such as a helicopter or drone. Likewise, one or more embodiments presented herein can be extended to controlling charging of a battery located on a robot and/or any suitable moving or stationary device. Other applicable applications include scooters, Segway®, electric bicycles, E-rickshaws, and the like. Further, one or more embodiments presented herein can be utilized to control charging of a battery, wherein the battery is a standalone device, e.g., the battery is not located on a vehicle, device, etc.

Further, the embodiments can be applied to any vehicle utilizing a battery charging system, e.g., a Battery Electric Vehicle (BEV) where the powerplant is only an electric motor powered by a battery and the battery is recharged via an external charging station, a Hybrid Electric Vehicle (HEV) having both a gasoline/petrol engine & fuel tank and an electric motor powered by a battery, wherein operation of the HEV recharges the battery (e.g., via a regenerative braking system capturing kinetic energy), a Plug-in Hybrid Electric Vehicle (PHEV) having both a gasoline/petrol engine & fuel tank and an electric motor powered by a battery, wherein the battery can be charged via an external charging station, and the like.

It is to be appreciated that while the various embodiments and concepts are presented as directed to lithium-ion battery technologies, the various embodiments and concepts can be equally applied to any battery technology, as further described below.

Battery Technology

A variety of energy storage systems can be utilized to store and provide electrical energy for EV's, including battery cells comprising lithium-ion (Li-ion), lithium nickel cobalt Aluminum (NCA), lithium-nickel manganese cobalt (NMC), lithium-manganese Spinel (LMC), lithium Titanate (LTO), lithium-iron Phosphate (LFP), lithium metal polymer (LMP), nickel manganese cobalt (NMC), nickel-metal hydride (Ni-MH), lithium sulphur (Li—S), lead-acid batteries, as well as ultracapacitors, super capacitors, chemical batteries, solid-state batteries, fuel cells, etc. The following is an overview of the various batteries available for EVs. The various embodiments presented herein are applicable to the various battery types described here along with any battery technology in development.

Li-ion batteries are rechargeable, and are commonplace as electrical energy storage systems, with applications ranging from EV's through to portable devices such as cellphones, laptops, cameras, etc. In comparison with other electrical energy storage systems, Li-ion batteries have a high energy per unit mass (e.g., 100-265 Wh/kg or 250-670 Wh/L), high charge density-to-weight ratio, high energy efficiency (e.g., 3.6V, which is 3 times that available with Ni—Cd, Ni-MH technologies), good high-temperature performance (e.g., can operate at −20° C./−4° F. to +60° C./140° F., although optimal operating temperature is ~25° C. (77 F), with a preferred operating range of +10° C./50° F. to +30° C./86° F.), and are low self-discharge (e.g., 1.5-2% per month versus 3%-20%/month for a lead-acid battery). Advantage can be taken of the Li-ion battery properties to manufacture batteries that are smaller than a comparable energy system using other technologies described below. Li-ion batteries can be recycled, but material recovery costs remain high. Accordingly, it is in the interest of not only the owner of an EV for the batteries to have operational longevity but also for the global economy and environment. Battery technology continuously develops with goals including lowering the cost of battery production, extending operational lifetime, and to simplifying material recovery and cost. Safety systems can be utilized with Li-ion batteries to prevent damage to the battery during sessions of repeated rapid charging over a short period of time, e.g., maintain charging below cut-off limit (e.g., 4.2V), prevention of thermal runaway, and the like.

Nickel-metal hydride batteries provide reasonable specific energy (e.g., 70-100 Wh/kg) and specific power capabilities (e.g., 170-420 Wh/L), with a much longer life cycle than lead-acid batteries. Nickel-metal batteries have a high cost, high self-discharge and heat generation at high temperatures, with a need to control hydrogen loss.

Lead-Acid batteries have a high power (e.g., 100 to 5.000 W/kg) while being inexpensive, safe, and reliable. However, use of lead-acid batteries is limited by their low specific energy (e.g., 10 to 30 Wh/kg), poor cold temperature performance, and short lifecycle. Research into lead-acid batteries continues, with applications in EVs to meet ancillary load demands.

Supercapacitors and ultracapacitors store energy as electrostatic charge rather than the preceding batteries which use chemical reactions. Super- and ultracapacitors can deliver a high power throughout for a short period of time and can be utilized to provide additional power during motor loading, e.g., during acceleration and driving uphill, and can assist with recovery of braking energy. However, super- and ultracapacitors have a low energy density (e.g., ~28 Wh/kg) which may have minimal contribution to a battery's range. Ultracapacitors can also find application as secondary energy-storage devices in EVs, particularly in levelling load power of electrochemical batteries.

All-solid-state-batteries (ASSB) are similar to Li-ion batteries but rather than using an electrolyte in liquid form, a solid electrolyte is utilized. Compared to many of the batteries already mentioned, solid state batteries can provide faster charges, more power (e.g., 320-430 Wh/kg), and lower production costs.

Also in development are aqueous-based, Li-ion air (Li—O2), Li—S, Li-ion silicon (Li—Si), ASSB, zinc-ion (Zn-ion), sodium-ion (Na-ion) batteries, etc., having the potential for greater storage capacity/driving distance for the same weight and volume of current battery technologies.

As further described herein, while a battery may look to be a singular unit, the battery is formed from a collection of smaller battery modules, wherein the battery modules are electrically interconnected to form the larger battery. Furthermore, each of the battery modules can further comprise a collection of cells, e.g., cylindrical, prismatic, pouch, coin, and the like, connected in series or parallel.

Battery Materials, Disposal, and Recyling

Batteries incorporate a range of hazardous materials, which can enter the waste stream, both during battery production and disposal. Hence, by lessening the need for overall disposal of batteries (e.g., by reducing degradation to extend operational lifetime) various societal pressures can be alleviated, including scarcity of raw materials, battery production costs, environmental hazards, reliance on fossil fuels, etc.

Battery State of Charge (SOC) and State of Health (SOH)

Generally, SOC is an indication of a percentage of charge left in a battery module (and a battery) and, accordingly, how far an EV can be driven before recharging. SOH is an indication of the health of a module, enabling determination of when a module is to be replaced and reduce economic losses. Various algorithms can be utilized to determine SOC utilizing such measurements as voltage, current, charging profile, and discharging profile for a module/cell. Such algorithms (e.g., offline and/or indirect0 include Coulomb counting (ratio of total charge input and maximum capacity of the module), ampere-hour (Ah), open-circuit voltage (OCV), impedance/impedance ratio measurement, chemical, voltage, current integration, and the like. Further, machine learning based algorithms can be utilized, such as neural network fuzzy logic, support vector machine, etc. A further technique is a state-space model estimation utilizing a Kalman filter.

Utilizing the Coulomb counting approach, per Equation 1:

SOC=total charge input/maximum capacity of a module. (Eqn 1)

The total charge input is based upon the current and time, however current can vary with time which can be corrected by mathematical integration, for example. Further, the maximum capacity of a module can change over time.

The converse of SOC is depth of discharge (DOD), where DOD indicates the percentage of charge in a module that has been consumed. SOC is typically referenced when considering the current state of charge of a module, while DOD is typically referenced when considering the lifetime of the module after repeated use.

Over time, as the SOH declines, the operational range of the EV per charge also declines. SOH can be based upon module capacity, module charge, internal resistance, and the like. SOH can be determined based upon the number of charge/discharge cycles, operational lifetime, and operational performance of the respective modules and battery.

SOH can be determined, in one approach, using the proportional relationship between the current maximum storable capacity and the module rated capacity, per Equation 2:

$$SOH = \frac{C_{aged}}{C_{rated}} \times 100\%$$ (Eqn 2)

where C aged is the maximum module capacity that the module can currently store and Crated is the module's rated capacity. In an example scenario, when the SOH percentage drops to 70%, the lithium-ion battery module is considered to have failed and should be replaced. Accordingly, as the SOH % for a module changes, the operational health of the module changes from "good" (e.g., SOH=100%) to "poor" (e.g., SOH=70%).

To facilitate determination of SOC, DOD, SOH, operational health of a module, etc., across a variety of operating conditions, various mathematical models can be utilized (e.g., by an artificial intelligence component). A model can operate with such parameters as charging voltage and current profiles, discharging voltage and current profiles, operational load, age, temperature, and the like. Any suitable model can be utilized to respectively determine SOC, DOD, SOH, etc., wherein such models include, in a non-limiting list, Lumped-Parameter model, Equivalent Circuit Model, Electro-chemical model, convolutional neural networks (CNN), long short-term memory (LSTM) by dropout regularization-based fully connected layer, time convolution memory neural network (TCMNN) combining CNN and LSTM, etc.

Factors Affecting Battery Operational Lifetime

Various factors can cause degradation, a reduction in the operational lifetime of a battery. Such factors can include operational use of the EV for which the onboard batteries are storing and providing electrical power, e.g., how is the EV being driven? Is the driver slowing the vehicle using brakes only or also implementing the EV's regenerative braking system (RBS) system? Is the driver accelerating aggressively to a desired speed or is the driver increasing the speed in a more energy efficient manner? Is there an alternative route to the one planned/being navigated, wherein the alternative route will cause less battery degradation? Operational use can also include the environmental conditions encountered during a journey, e.g., is the weather temperature cold (e.g., less than 10° C. or 50° F.), moderate (e.g., between 10° C. to 30° C. or 50° F. to 86° F.), or hot (e.g., over 30° C. or 86° F.)? Is the parking location cold (e.g., less than 10° C. or 50° F.), hot (e.g., over 30° C. or 86° F.)? Over time, the storage capacity of a battery can diminish with an increase in internal resistance.

Degradation

Three stress factors influencing battery degradation are operational temperature, SOC, and load profile. Generally, temperature is the most significant stress factor whereby deviations from the optimum operating temperature, $t_{opp}$, 25° C. (77° F.) can lead to accelerated failure. Degradation can also result from higher SOC operation as a function of the relationship between the electrode potentials and the rate of parasitic side reactions. Higher current operation (high load profiling) increases a likelihood of failure due to mechanical stresses developing in a module during cycling, and also lithium plating being promoted during charging. The repeated charging and discharging processes a battery undergoes through its operational lifetime leads to a reduction in the amount of charge (energy) a battery can hold. As the charge held by a battery reduces over the lifetime of the battery, the operational range of the EV reduces, with more frequent charges being required. Degradation can lead to capacity fade, a reduction in the usable capacity of a battery cell. Degradation can also lead to power fade, a reduction in the deliverable power of the cell as a function of the degradation. Modes of degradation can include loss of active electrode material in a battery, loss of transport ions (e.g., loss of Li ions), stoichiometric drift of electrodes, impedance change in the battery, etc. An impedance increase (resistance increase) can result from high temperature operation.

The respective position of a first battery module relative to the respective position of other modules can give rise to a variation in operational conditions. For example, modules positioned on, or near, the exterior, of the battery pack may experience the thermal conditions of the environment of operation to a greater extent than those modules which are positioned in, or near the center of the battery pack. Accordingly, the modules located at/near the exterior of the battery pack may experience different thermal conditions during operation than the thermal conditions experienced by those modules located near the interior of the battery, for example:

$$\text{operating temperature measured at an interior battery module} = t_i \quad \text{(Eqn 3)}$$

$$\text{operating temperature measured at an exterior battery module} = t_e \quad \text{(Eqn 4)}$$

$$\text{environmental effect} = EE = t_e - t_i. \quad \text{(Eqn 5)}$$

In an embodiment, a module/battery pack may be designed to operate most efficiently at a particular temperature of operation, $t_{opp}$, (25° C./77° F.) during charging/discharging of the battery, and thermal regulation of the battery pack during EV operation is undertaken to maintain the module at an operating temperature as close to $t_{opp}$ as possible, wherein the thermal regulation is likely to be easier to achieve at the center of a pack of modules than at the exterior. If it is assumed that the operating temperature $t_i$ of an interior module is substantially close to $t_{opp}$, then EE is +ve where the thermal effects of the operating environment (e.g., weather) are hotter than the operating temperature of a module and EE is −ve when the operating environment is colder than the operating temperature of the module. For the modules to function most efficiently (e.g., maximizing the SOC and SOH lifetime of a module), thermal regulation of the module should be conducted to achieve $t_{opp}$ or as close thereto as possible.

Considerations regarding operation and thermal control of the modules include frequency, duration, and energy profile during charging/discharging of the battery, environmental conditions of operation (e.g., is the car being driven on a hot day (e.g., over 30° C./86° F.)?, a cold day (e.g., less than 10° C./50° F.?)), is the car parked in an unshaded location (e.g., an open air parking lot, an unshaded street), is the car being parked in a shaded location (e.g., in an interior floor of a parking garage, a treelined street providing shade), and the like.

Li-ion batteries can store and provide electrical energy over a wide temperature range (e.g., −20° C. to +60° C., −4° F. to 140° F.), however, the optimal temperature range to maximize battery lifetime is narrower (e.g., +10° C. to +30° C., 50° F. to 86° F.), with $t_{opp} \approx 25°$ C. (77° F.). The further the temperature of operation deviates from $t_{opp}$, the degree of degradation of the battery increases/accelerates, and may become significant in hot (e.g., over 30° C. or 86° F.) and/or cold climates (e.g., less than 10° C. or 50° F.?).

Battery degradation can occur as a result of cycle aging (occurring when the battery is in use or being charged) and calendar ageing (occurring while the battery is at rest). While battery discharge can occur while in use, battery discharge can also occur while the battery is at rest.

EV System Overview

Turning to the drawings, FIG. 1 illustrates a system 100 that can be utilized mitigate battery degradation. System 100 is a high-level representation of respective equipment, devices, components, etc., that can be located onboard an EV 101. To facilitate understanding, an example scenario of operation and component interaction is briefly presented at the conclusion of the description of FIG. 1, below.

System 100 comprises various components, etc., wherein the various systems and components included therein can be connected by one or more electrical circuits (hardwired, wireless, etc.) to facilitate the provision of electrical charge between the systems and components. Further, the various systems and components can be connected by one or more communications circuits (hardwired, wireless, etc.), e.g., a system bus (e.g., a controller area network (CAN) bus, a local interconnect network (LIN) bus, and the like), providing transmission and reception of data, measurements, information, instructions, and the like, between the respective systems and components.

In an embodiment, a battery system 105 includes various components to store and supply energy for operation of the EV. An EV system 140 comprises various vehicle components 142A-n to facilitate operation of the EV, where such components include a motor 145, braking system 146, etc. In an embodiment, the vehicle components 142A-n can be grouped in order of importance of operation for energy supply, e.g., a first subset of vehicle components 142A-n can be considered to have a high operational value (high importance) while a second subset of vehicle components 142A-n can be considered to be of low operational value (low importance), as further described.

In a further embodiment, a vehicle control unit (VCU) 160 (e.g., an onboard computing system), can be utilized to provide overall operational control and/or operation of the EV. As further shown in FIG. 1, the VCU 160 can be communicatively coupled to a presentation component, a human-machine interface (HMI) 190 (e.g., a display, a graphical-user interface (GUI), and the like. HMI 190 can be incorporated into an instrument cluster, dashboard, etc. The HMI 190 can be configured to receive and present information, data, alarms, alerts, warnings, instructions, and the like, to an operator (e.g., a driver) of the EV regarding operation and/or operating conditions of the EV, wherein the information, data, etc., can be presented on one or more screens 191A-n on the HMI 190. The screens 191A-n can also be configured to facilitate input of information/settings/etc., user input data 195, from the operator regarding current and/or future operation of the EV, wherein the HMI 190 can transmit the data, etc., to the VCU 160, and the other systems included in the EV. Similarly, HMI 190 can include one or more user profiles 170A-n to be presented on HMI 190 regarding an operator of the EV, e.g., information regarding how the operator is operating the EV, "is the EV being driven in compliance with a recommended procedure?", historical operation of the EV by the operator and effect on battery degradation, and the like. The presented user profiles 170A-n can be based on the user profiles 170A-n utilized in by the VCU 160, as further described herein.

The various systems can respectively include an I/O component to facilitate communication of data, instructions, sensor data, etc., between any of battery system 105 (via I/O component 137), the EV system 140 (via I/O component 152), the VCU 160 (via I/O component 186), external devices, external sensors, etc.

As further shown in FIG. 1, I/O component 186 can be configured to facilitate interaction between the EV and external components, etc. I/O component 186 can be communicatively coupled, via an antenna 187, to remote devices (RD), user equipment (UE), cloud computing systems, the Internet of Things, etc., such as UE 196 (e.g., a cellphone), to facilitate remote interaction with various components comprising system 100 and further facilitate transfer of data 198 (e.g., operational data, configurations, route data, traffic data, weather data, and the like) to and from system 100 and the remotely located devices and systems 196.

The battery system 105 can include a variety of components. In an embodiment, battery system 105 can include a high voltage battery (HVB) 110, (also known as a battery pack, traction battery pack). The HVB 110 can comprise a collection of modules (or cell holders) 111A-n, with each of the modules being respectively identified. For discussion purposes, HVB 110 is depicted as modules 111A-n as comprising 54 modules, respectively labeled A1-F9, however, n can be any positive integer, with any suitable labeling system utilized. FIG. 1 provides two representations for HVB 110, a top down view in direction 'y', enabling depiction of the labeled modules A1-F9, and a side view representation in direction 'x' enabling depiction of the modules A1-F9 being packed together, and electrically coupled, to form the HVB 110. As shown in FIG. 1, in an embodiment, HVB 110 can be configured to provision power (e.g., typically 100-800V) to an electric motor (e.g., motor 145) to facilitate motion of the EV, wherein the electrical energy from the HVB 110 can be transferred to the motor 145 (and other vehicle components 142A-n) via power cable 114.

In another embodiment, a second battery, low voltage battery (LVB) 112 can be located onboard the EV, wherein LVB 112 can be configured to provide power (e.g., typically 12-48V) to various vehicle components 142A-n, e.g., components included in the EV system 140, battery system 105, the VCU 160, HMI 190, etc. While the vehicle components 142A-n are depicted as being incorporated into the EV system 140, any of the respective vehicle components 142A-n (including motor 145) can be located anywhere in the EV. Similar to the modular construction of HVB 110 comprising modules 111A-n, LVB 112 can be a battery pack constructed from a collection of low-voltage modules 113A-n, combined and identified in a manner similar to that of the modules 111A-n in HVB 110. To prevent repetition, while the various embodiments presented in the various figures are directed towards HVB 110 and modules 111A-n, the various concepts presented herein are similarly applicable to LVB 112 and modules 113A-n.

During operation of the EV, HVB 110 and LVB 112 provision electrical charge to the motor 145 and various vehicle components 142A-n located on the EV. To compensate for any lost charge at a battery owing to discharging charge to power other components, batteries HVB 110 and LVB 112 are recharged. In an embodiment, HVB 110 is typically charged by an external charging system (CS), e.g., CS 116, while LVB 112 is typically charged via an onboard charging system (e.g., OS 118, a DC-DC charging system) configured to draw energy (down convert) from the HVB 110 to the LVB 112. It is to be appreciated that while the various embodiments presented herein describe charging via an external CS, the CS can also be located on-board the EV, e.g., charging via an on-board photovoltaic array. Accordingly, while the HVB 110 is primarily configured to provide energy for the motor 145, the HVB 110 is also providing energy to the LVB 112 and the various vehicle components 142A-n powered therefrom. Hence, a vehicle component 142F (e.g., an interior lighting system) that is powered by the LVB 112 is effectively drawing power from the HVB 110, as the HVB 110 can be a primary energy source for the LVB 112 recharging operation. The repeated charge and discharge can lead to degradation (charge cycle fading) of the SOH of respective batteries HVB 110 and LVB 112 and respective HVB modules 111A-n and LVB modules 113A-n.

During repair and/or battery upgrade, single modules (e.g., any of modules 111A-n in HVB 110 or modules 113A-n in LVB 112) can be removed and replaced with a new module. Respective modules can be configured and located such that a first set of modules which may undergo a faster rate of degradation than a second set of modules can be located on the EV such that they can be easily removed, e.g., by roadside assistance, in a home garage, at a service center, and the like. While not depicted in FIG. 1, the various modules combined to form the respective batteries, HVB 110 (e.g., modules 111A-n) and LVB 112 (e.g., modules 113A-n), can be electrically coupled with connections, circuits, componentry, devices, etc., as required to facilitate the construction and operation of HVB 110, LVB 112, and the like.

As mentioned, the respective vehicle components 142A-n can have a range of importance of operation of the EV, e.g., vehicle component 142A can be of high value to operation of the EV (e.g., motor 145 and associated components necessary for propulsion of the EV). Some vehicle components can be of lesser value for operation of the EV, e.g., vehicle components 142B, such as an air conditioning unit 148 for the passenger compartment. Accordingly, per various embodiments presented herein, operation of the battery modules can be controlled to provide power to a first vehicle component (e.g., a high value component) while ceasing power to a second vehicle component (e.g., a low value component), e.g., to enable a journey to be completed, to lessen degradation of a module(s), and the like.

Based upon, for example, operational health of the various modules 111A-n and 113A-n, operation of the modules can be respectively separated into various subsets, wherein a first subset of modules having a first operational health can be utilized to provision power to respective vehicle components 142A-n, while a second subset of modules having a second operational health are isolated and not utilized to provide power to any vehicle components while, e.g., a deleterious operating condition exists. In an alternative embodiment, a subset of modules may be controlled to only provide power to a subset of vehicle components 142A-n.

In an embodiment, the battery system 105 can include a battery management system (BMS) 115, whereby BMS 115 can be configured to control respective operation and/or charging of HVB 110 and/or LVB 112, e.g., as previously described regarding selection of one or modules for powering respective vehicle components 142A-n. BMS 115 can be configured to perform a variety of functions as required, including any of (in a non-limiting list):

(a) ensuring that various modules (e.g., all modules 111A-n, or a selected subset) are charged/discharged in unison to maximize battery efficiency, (b) detect an electrical irregularity such as a short circuit in a module, (c) ensure discharging of a module never causes the voltage of a module to drop below the "under voltage rating" (e.g., a 3.7V Li-cell does not drop below a cut-off voltage of ~3V during discharge), if the under voltage rating is being approached, the BMS 115 is configured to cease utilizing the cells/module. If a module discharges below the cut-off voltage, the module "over discharges", which can affect the electrical capacity and lifetime of the module, and possibly the chemical composition of the cell(s) in the module which can lead to thermal runaway, overheating/fire.

(d) ensure charging of the module does not exceed the "maximum charge voltage", which is the maximum voltage a module can reach. Charging increases the voltage of a module. E.g., if the charge voltage for a Li-cell is nominally 3.7V, the maximum charge voltage (aka "over voltage rating") is 4.2V. Overcharging also results from a module being charged above the maximum charge voltage, and can lead to permanent damage of the module, as well as thermal runaway, fire, etc., (e) control charging as a 2-stage process (e.g., $1^{st}$ stage constant current, $2^{nd}$ stage constant voltage with low current), (f) charging voltages and currents do not exceed permissible limits so as to not over charge or fast charge the modules, (g) determine the SOC of a battery/modules based upon predicting the battery capacity resulting from monitoring the voltage and charge/discharge current of the battery and modules (e.g., by Coulomb counting), (h) determine the SOH of a battery by monitoring age and expected life cycle of the battery based upon its usage history (e.g., to determine EV mileage/distance covered after a full charge), (i) cell balancing to ensure equal charging and discharging of modules in the battery. E.g., if one module has a pre-charge of 3.5V and the remaining modules have a pre-charge of 4.0V, with a 0.2V charge, the single module will be at 3.7V and the remainder at 4.2V. Hence, it is likely that the single module will discharge to 3V (per the under voltage rating example previously mentioned) before the remaining modules, with the compromised potential of the single module comprising the efficiency of all of the modules. Cell balancing can be achieved by various techniques, including passive balancing to discharge the excess voltage of a first set of modules to a second set of modules having a lesser charge; active balancing where the stronger modules are used to charge the weaker modules to equalize their potentials, etc., (j) maintaining thermal control of modules. As mentioned, the life and efficiency of a Li-ion module is dependent upon its operating temperature. Modules generally drain faster when operated at higher and lower temperatures (e.g., $t_{opp} \approx 25°$ C. (77° F.), preferred operating temperature range (reduced degradation)+10° C. to +30° C., 50° F. to 86° F., and operating temperature range with higher level of degradation is −20° C. to +10° C. and +30° C. to +60° C., −4° F. to 50° F. and 86° F. to 140° F.). Modules generally discharge faster in a hot operating climate than at room temperature, wherein the fast discharge further increases the operating temperature. Further, the operating temperature should be increased when operating in cold climate conditions. The BMS can control operation of a thermal regulation system that, e.g., controls temperature and flow of a coolant/heating fluid routed through respective modules, air cooling, chemical cooling, and the like, (k) monitor and log charging history of the modules, e.g., to enable respective module's SOH to be determined. Such data can include charge cycles, charging duration, time of charge from the date of installation, etc., and can be included in the battery data 138, (l) accurate determination of charging and discharging voltages to accommodate for vagaries in voltages (increased/decreased) during charging/discharging to enable accurate discharge curves (voltage v. time) to be generated by the BMS 115, e.g., to be utilized by the mathematical models.

As depicted in FIG. 1, HVB 110 can be connected to CS 116, e.g., via internal and external cabling system 117, (e.g., as an AC-DC charging operation) with LVB 112 either also being charged directly from CS 116, or as an on-board ancillary DC-DC operation from HVB 110, via OS 118 (as previously described). A first portion 117A of the cabling system is located onboard EV 101 while a second portion 117B is the cable between the charging port on the EV 101 and the CS 116. The cabling system 117 can comprise data-carrying cables (e.g., fiber optics) as well as electric charge-carrying cables. As a function of the charging operation, the CS 116 can be electrically coupled with the HVB 110, the LVB 112, and the BMS 115, whereby the various operating checks and handshakes (e.g., regarding charging protocols and conditions) between CS 116 and BMS 115 can be performed/completed during charging initiation and completion (e.g., based upon any of level 1 charging (110-120V), level 2 charging (220-240V), level 3 (400V+) DC fast charging, AC charging, DC charging, battery voltage limit, battery current limit, battery capacity, battery condition, battery deterioration, battery temperature, charge slow down rate, charger capacity, ramping up charging, ramping down charging, charging decay, and the like). The various embodiments presented herein relate to any charging operation, whether it is a home charging system (e.g., CS 116 is located at a home garage), a public charging station comprising one or more charging stations (e.g., CS 116 is one of many charging stations located in the public charging station), a photovoltaic array, etc.

In an embodiment, the BMS 115 can be configured to "buffer" an amount of charging that a battery (e.g., HVB 110, LVB 112) can undergo to increase the operational lifetime of the battery. In an embodiment, the BMS 115 can "buffer" the charge provided by the CS 116 to prevent the modules 111A-n being overcharged during a charging operation.

In a further embodiment, the battery system 105 can include a battery operation component 120 which can be utilized to control operation of a respective module 111A-n and/or module 113A-n. As previously mentioned, and as further described herein, subsets of modules can be selected (e.g., via switchable connectors, per FIG. 2) to provision, or not provision power, to any of the vehicle components 142A-n, or subsets thereof.

As shown in FIG. 1, a group of sensors 130A-n can be connected to the respective modules of HVB 110 (e.g., modules 111A-n) and LVB 112 (e.g., modules 113A-n). The sensors 130A-n can be utilized to generate sensor data 131A-n enabling determination of operational status (e.g., SOC, SOH, and the like) of any of the respective modules included in HVB 110 and LVB 112, and accordingly, the overall operational health of the HVB 110 and LVB 112, wherein sensor data 131A-n can pertain to any measurable parameter, e.g., voltage, current, temperature, impedance, capacitance, and the like.

The sensors 130A-n can be communicatively coupled to a battery monitoring component 125, wherein the communicative coupling can be via any suitable technique, e.g., a hard-wired electric circuit, wireless technology, and the like. The battery monitoring component 125 can be configured to receive the respective sensor data 131A-n generated by the sensors 130A-n, regarding one or more operational status' of the respective module 111A-n or 113A-n being monitored by respective sensor 130A-n. The battery monitoring component 125 can be further configured to process the sensor data 131A-n received from the sensors 130A-n and transmit the sensor data 131A-n to one or more other components configured to utilize the sensor data 131A-n to determine the operational health of the batteries HVB 110 and LVB 112 and the respective modules, wherein the processed sensor data 131A-n can be analyzed by the BMS 115, the VCU 160, etc. A variety of technologies can be utilized to determine the operational health of a module, e.g., temperature can be determined with negative temperature co-efficient (NTC) process, voltage (and temperature) using an analog front end IC, and the like.

In an embodiment, the ability to physically measure an operating condition at any of the modules 111A-n (e.g., with one or more sensors 130A-n incorporated into a module) may interfere with the operation of the respective module. To address the issue, digital modules 132A-n can be generated, wherein the digital modules 132A-n are mathematical models (a "digital twin") configured to replicate performance and behavior of the corresponding physical modules 111A-n and 113A-n, enabling the module's SOC, SOH, etc., to be determined. The digital modules 132A-n can be utilized to predict the long-term behavior of the physical modules, with the digital modules 132A-n being resynchronized, as needed, with actual measurements obtained from sensors 130A-n, e.g., voltage, temperature, current, etc. The digital modules 132A-n can be utilized by the battery monitoring component 125, with the digital modules 132A-n configured to be accurate and with fast updating to facilitate generation of results in real time to replicate the physical processes occurring at the modules 111A-n and 113A-n. In an embodiment, the digital modules 132A-n can also be updated and trained with data 198 received from an external entity, e.g., the battery/module manufacturer, EV manufacturer, third party vendor, and the like. Hence, the digital modules 132A-n can be simulating the modules 111A-n and 113A-n but can also be trained and the like with external data.

As further shown in FIG. 1, the respective components (e.g., BMS 115, battery operation component 120, battery monitoring component 125) can either be standalone components respectively comprising a computer processor and memory to facilitate respective operation of the respective components, and/or the components can be computer instructions, codes, product, etc., executable by processor 133, and stored in memory 135, as required to facilitate the various embodiments presented herein.

Further, the respective components, etc., included in the battery system 105 can be respectively configured to generate battery data 138 regarding respective operation and functionality of the components in battery system 105, e.g., based on and including battery sensor data 131A-n, and data generated by sensors and processing equipment in each of the respective components, etc. The battery data 138 can be stored and operated on locally, e.g., in memory 135 and by processor 133, as well as transmitted across the system 100 for analysis, storage, review, etc., by other components located therein, and also external devices. Battery data 138 can include any data or information pertaining to HVB 110, modules 111A-n, LVB 112, and/or modules 113A-n, such as an operational condition, above threshold condition, below threshold condition, module is at threshold condition, SOH, SOC, DOD, maximum charge held, lowest charge, number of charging cycles, operational lifetime, amount of time spent charging, amount of time spent discharging, amount of energy provided to respective vehicle components 142A-n, usage history, charging profile, discharging profile, current, voltage, capacitance, thermal history, etc.

Further, a battery warranty 139 can be stored in memory 135, with the warranty being invalidated if operation of the EV causes degradation of the modules beyond a level deemed acceptable, particularly after the operator had been warned that their operation of the EV was unacceptable as it caused unnecessary module degradation. The BMS 115 can invalidate the battery warranty 139 based on instruction from the VCU 160.

As further shown in FIG. 1, input/output (I/O) component 137 can be configured to facilitate interaction between the battery system 105 and other components, etc. For example, I/O component 137 can be utilized to communicate data, instructions, sensor data (e.g., sensor data 131A-n, battery data 138), etc., between the respective elements of system 100, e.g., between battery system 105 and the EV system 140, the VCU 160, the HMI 190, etc.

FIG. 1 further presents various components that can be included in the EV system 140. As mentioned, the EV system 140 can include a motor 145. Depending upon the EV, e.g., total EV, BEV, HEV, PHEV, the motor 145 has either totally or partially replaced the combustion engine in the EV. The motor 145 can be of any suitable technology, e.g., AC induction motor, brush-less DC (BLDC) motor, BLDC hub motor, BLDC in-runner motor; brushed DC motor, and the like. While not shown, the motor 145 typically operates in conjunction with a motor controller system, configured in part to facilitate the conversion of DC energy provided by the HVB 110 into AC required for operation of the motor 145.

EV system 140 can further include a braking system 146 comprising various components utilized in reducing speed/velocity (deceleration, slowing, stopping, parking) of the EV. During operation of the EV, the EV can be slowed by application of the brakes (as per a non-EV). The braking system 146 can also include an RBS configured to harness energy from the braking operation, directing kinetic energy from the slowing motor 145 back into the battery (e.g., HVB 110) via an energy return cable 157. Effectively, a RBS is converting kinetic energy that would otherwise be lost as thermal energy in the brake pads as well as heat friction in tires and redirects it to the battery (e.g., HVB 110) to be subsequently available to power the EV. Utilizing an RBS can be beneficial in mitigating module degradation as the harnessed energy can be returned to the battery (e.g., HVB 110), thereby reducing the overall energy discharge of the battery during a journey.

EV system 140 can further include an acceleration system 147 comprising various components (e.g., an accelerator) utilized in increasing/maintaining speed/velocity/acceleration of the EV. During operation of the EV, application of the accelerator causes power (e.g., from HVB 110) to be fed to the motor 145, the greater the acceleration to a particular speed, the greater the power load/energy draw from the battery (e.g., HVB 110).

As previously described, the EV can include various components deemed to be of high operational value to the EV (e.g., vehicle components 142A) and of low operational value to the EV (e.g., vehicle components 142B). In an embodiment, high value vehicle components 142A can include those components required to operate the EV during operation (e.g., during driving), wherein the operation of the EV can be focused on completing a journey in a safe manner. In a non-limiting list, the high value vehicle components 142A can include the motor 145, the braking system 146, the acceleration system 147, one or more components previously described with regard to the battery system 105, the VCU 160 and one or more components included therein, the HMI 190, etc.

In an embodiment, low value vehicle components 142B can include those components onboard the EV that are largely directed to operational comfort while driving the EV. In a non-limiting list, the low value vehicle components 142B can include an air conditioning unit for the passenger interior, interior lighting system, etc.

In an embodiment, respective modules 111A-n can be selected (e.g., by battery operation component 120) to not be utilized in charging the LVB 112. In an embodiment, the energy stored in the HVB 110 can be utilized to maintain operation of high value vehicle components, e.g., vehicle components 142A-C, while low value vehicle components, e.g., vehicle components 142D-F, may have their respective operations temporarily terminated. In an embodiment, the LVB 112 may be connected to one or more low value components 142D-F, and operation of one or more of the low value vehicle components 142D-F may be curtailed to prevent energy being drawn away the HVB 110 to recharge the LVB 112 as it provides charge to the low value components 142D-F. In an example scenario, operation of the air conditioning system can be temporarily terminated so that electrical energy can be retained in the HVB 110 to provision energy to the motor 145 to enable completion of a journey, or at least a sufficient distance to reach a CS 116 for a recharge to enable the journey, or a portion thereof, to be completed. This example scenario may require the degradation component 163 to inform the module selector (e.g., battery operation component 120) to select all of the modules 111A-n to be utilized for that portion of the journey.

EV system 140 can include a computer processor 150 and memory 151 to facilitate respective operation of the respective EV system components, and/or the components can be computer instructions, codes, product, etc., executable by processor 150, and stored in memory 151, as required to facilitate the various embodiments presented herein. The respective components included in EV system 140 can be communicatively coupled by any suitable connection, e.g., CAN bus, LIN bus, wireless technology, and the like. The respective components, etc., included in the EV system 140 can be respectively configured to generate system data 155 regarding respective operation of the components, e.g., generated by sensors and processing equipment in each of the respective components, etc. The system data 155 can be stored and operated on locally, e.g., in memory 151 and by processor 150, as well as transmitted across the system 100 for analysis, storage, review, etc., by other components located therein, or external devices.

As further shown in FIG. 1, an input/output (I/O) component 152 can be configured to facilitate interaction between the EV system 140 and other components, etc. For example, I/O component 152 can be utilized to communicate data (e.g., system data 155), instructions, sensor data, etc., between the respective elements of system 100, e.g., between battery system 105 and the EV system 140, the VCU 160, etc.

FIG. 1 further presents various systems/devices/equipment/components that can be included in the VCU 160. The VCU 160 can include a degradation component 163, as further described, the degradation component 163 can review operation of the EV, battery status (e.g., based on sensor data 131A-n, battery data 138), EV system operation (e.g., system data 155), etc. The degradation component 163 can utilize a plurality of degradation models 164A-n which are configured to determine degradation of a module, wherein the degradation models 164A-n can be empirical, semi-empirical, physics-based models, and the like. The degradation models 164A-n can be updated to stay up to date with current understanding of the various degradation processes.

In an embodiment, the degradation component 163 can further generate one or more thresholds 165A-n to enable various operations to be performed including assessment of the operational health (such as SOH, SOC, etc.) of the modules 111A-n to be assessed, selection of a subset of modules 111A-n, determination of whether one or more modules 111A-n should be replaced (e.g., to maintain the SOH of all the modules 111A-n), determination of which vehicle components 142A-n can be utilized based upon one or more operational conditions of the modules 111A-n, and the like. In a non-limiting list, parameter thresholds 165A-n for the modules 111A-n (and modules 113A-n) can be based upon any of a determined median value of the measurements, a determined average value of the measurements, determining the range of measurements and determining modules based upon a number of modules above or below a threshold, determining a range of measurements and determining modules based upon a percentage of the range (e.g., 5 modules are at 95% SOH, 10 modules are at 91% SOH, 6 modules are at 85% SOH, etc.), determining a cutoff threshold to create a first subset of modules above the threshold and a second set of modules below the threshold, manually applying a threshold entered by the operator/service engineer (e.g., via a screen 191A-n), etc.

Thresholds can be utilized (e.g., BMS 115, battery operation component 120, components located in the VCU 160, and the like) to function as a selection threshold, wherein a threshold can be determined and modules selected based thereon. In a first example scenario, where measurements are not to go above a threshold value (e.g., upper module temperature threshold temperature is set at +30° C./86° F., voltage not to exceed 4.2V during charging of the module, and the like), the threshold can be respectively set to the upper threshold value, and any modules having a measurement above the threshold value can be selected (e.g., to be utilized to supply power to one or more vehicle components 142A-n). In a second example scenario, where measurements are not to go below a threshold value (e.g., lower module temperature threshold temperature is set at +10° C./50° F., voltage not to drop below 3.2V during operation of the EV, SOH is not to drop below 80%, and the like), the threshold can be respectively set to the lower threshold value, and any modules having a measurement below the threshold value can be selected (e.g., to be utilized to supply power to one or more vehicle components 142A-n). In a third example scenario, where preferred operation of a module is between a range (e.g., temperature of a "good" module is between +10° C./50° F. to +30° C./86° F., voltage of a "good" module is between 3.5V and 4.2V, and the like), a pair of thresholds (such as a first threshold, upper threshold, second threshold, lower threshold, etc.) can be utilized to select modules that are considered to be functioning with anticipated degradation (e.g., satisfactory SOC, SOH, etc.), and those modules can be selected to no longer provide (preclude from providing) power (e.g., to one or more vehicle components 142A-n), e.g., while the modules determined to be outside of the pair of thresholds are selected to provide power (e.g., to one or more vehicle components 142A-n).

As further mentioned herein, thresholds 165A-n generated by the any onboard component, e.g., component(s) in battery system 105, component(s) in EV system 140, component(s) in VCU 160, can be supplemented by one or more thresholds received from an external system 196. For example, the EV manufacturer can forward a threshold(s) to be utilized on EV 101 (e.g., by any components(s) in battery system 105, in EV system 140, or in VCU 160).

The VCU 160 can further include a vehicle operation component 166 which can be configured to monitor and control operation of the EV, for example, based upon received data (e.g., system data 155 from the braking system 146 regarding how the brakes are being applied, system data 155 from the acceleration system 147 regarding application of the accelerator, and the like). Vehicle operation component 166 can be further configured to generate operational data 167A-n indicating one or more operational conditions of the EV. Operational data 167A-n can include any data or information pertaining to operation of the EV101, any of the vehicle components 142A-n, HVB 110, modules 111A-n, LVB 112, modules 113A-n, etc., such as an operational condition, above threshold condition, below threshold condition, module is at threshold condition, SOH, SOC, DOD, maximum charge held, lowest charge, number of charging cycles, operational lifetime, amount of time spent charging, amount of time spent discharging, amount of energy provided to respective vehicle components 142A-n, usage history, etc.

In another embodiment, the VCU 160 can be configured to generate one or more corrective operations (168A-n), (also known as corrective action(s), corrective mode of action(s), alternative action(s), alternative mode of operation(s), and the like), which can be implemented to mitigate unnecessary module degradation. A corrective operation 168A-n can be any action to mitigate/reduce/attenuate/prevent degradation of a module, whether the degradation is currently occurring or has the possibility of occurring. The one or more corrective operations 168A-n can include, in a non-limiting list, an alternative route 173A-n, cessation of power to one or more vehicle components 142A-n, driving at a different time than scheduled, terminating provision of power from one or more modules 111A-n or 113A-n, replacement of one or more modules 111A-n or 113A-n, alteration of driving style (e.g., use RBS 146, accelerate less aggressively), and the like.

It is to be appreciated that while the one or more corrective operations 168A-n are depicted in FIG. 1 as being located at the vehicle operation component 166, the corrective operations 168A-n can be generated by any component in system 100. For example, the AI component 180 can determine a corrective operation, e.g., as part of the application of computational models 181A-n to various data provided by one or more components in system 100, such as battery data 138, system data 155, VCU data 161, user profiles 170A-n, routes 173A-n, user input data 195, external data 198, data generated by degradation models 164A-n, and the like. Similarly, the route component 172 can generate one or more corrective operations 168A-n, such as an alternative route that is less hilly, more shaded, has a destination with covered parking, less congested, a route that is longer in distance but quicker to navigate, and the like.

Similarly, the degradation component 163 can generate one or more corrective operations 168A-n, such as identifying (e.g., from system data 155) that the operator could mitigate module degradation by implementing RBS or accelerating less aggressively. The degradation component 163 can also identify a corrective operation 168A-n that terminates use of the air conditioning unit 148 to enable only a subset of degraded modules in the modules 111A-n to be utilized, while a subset of lesser degraded modules in the modules 111A-n to be disconnected from providing power.

In another embodiment, an external system 196 can be monitoring operation of the EV 101, wherein the external system 196 can generate one or more corrective operations 168A-n. Further, the schedule component 182 can generate one or more corrective operations 168A-n, such as a route that enables a module to be replaced at a particular time, e.g., a module is scheduled to be replaced in a few weeks but the service center has new availability and the module can be replaced sooner.

In another example scenario, the battery management system 115 determines, e.g., from the sensor data 131A-n and/or one or more of the digital modules 132A-n that an anode of a module is failing unexpectedly and the number of components powered by the HVB 110 has to be reduced. In another example, the VCU 160 can receive battery data 138 from the BMS 115 indicating the amount of power available from the various modules and based upon a threshold 165A-n of degradation, a first amount of power available from a first set of modules in the modules 111A-n and a second amount of power available from a second set of modules in the modules 111A-n, wherein the first set of modules have a SOC measurement below a threshold value (a poor SOH) and the second set of modules have a SOC measurement above the threshold value (a good SOH). To prevent the first set of modules causing degradation of the second set of modules, the VCU 160 can generate one or more corrective operations 168A-n based upon the power identified by BMS 115 for the respective modules, wherein the one or more corrective operations 168A-n curtail use of one or more vehicle components 142A-n to isolate power to only be provided by the first set of modules.

The VCU 160 can also include a profile component 169 which can be configured to generate one or more user profiles 170A-n, wherein each profile can be uniquely generated for each operator/driver of the EV. Accordingly, data generated by various devices in system 100 can be added to a respective user profile in user profiles 170A-n enabling the vehicle operation component 166 to review and make determinations based upon how an individual is operating the EV. For example, the system data 155 received at the VCU 160 from the EV system 140 can include system data 155 generated by the braking system 146 and acceleration system 147, enabling the vehicle operation component 166 to determine that a particular driver's driving style is one of high acceleration with frequent braking, and the driver has a "lead foot". Further, the user profiles 170A-n can be updated with the operational data 167A-n, alarm data 177A-n, and the like, as pertain to the operator.

The VCU 160 can further include a route component 172, which can be configured to generate routes and other information regarding a previously conducted journey, a journey currently being undertaken along a route, or a proposed route(s) for a future journey. Various information regarding a conducted route, future route, etc., can be stored in route data 173A-n. The route data 173A-n can be updated with current and future travel information regarding one or more routes, wherein the updates can be received by the route component 172 from an external system 196, e.g., via I/O component 186. Further, the route component 172 can receive one or more inputs regarding a current or proposed route (e.g., via HMI 190 and screens 191A-n). Route data 173A-n can further comprise information regarding prior routes, wherein the AI component 180 can, in an embodiment, utilize the route data 173A-n to make a determination regarding a proposed alternative route presented by the AI component 180, e.g., to reduce degradation of a module 111A-n during a journey (e.g., an alternative route having a flat topography, a route near a service center available to replace a service module, a route avoiding hot (e.g., over 30 C or 86 F) or cold (e.g., below 10 C or 50 F) driving conditions, a destination having a covered parking space, etc.).

In an embodiment, the VCU 160 can further comprise an alarm component 176 configured to generate one or more alarms 177A-n (e.g., alarms, alerts, warnings, etc.). Alarms can be generated by any suitable method, e.g., alarms 177A-n can be presented visually and/or audibly on the HMI 190.

As mentioned, the VCU 160 can further include an artificial intelligence (AI) component 180, which can be configured to utilize one or more computational models 181A-n on data generated by various components located onboard the EV (e.g., "trained" with battery data 138, system data 155, VCU data 161 (as further described), user input data 195 (as further described)) in conjunction with external data 198 (e.g., weather data, routing data, mapping data) received from external devices pertaining to operation of the EV with regard to one or more embodiments presented herein. The AI component 180 can also utilize the degradation models 164A-n to address operational degradation of the modules 111A-n and 113A-n.

In another embodiment, external operational data 192 can be received from the EV manufacturer, the battery/module manufacturer, other third party. In an embodiment, the external operational data 192 can be generated by the EV manufacturer and can be received at the VCU 160 (e.g., stored in memory 184), wherein the external operational data 192 can be compiled by the EV manufacturer from other EVs being operated under various operating conditions, e.g., various weather conditions, routes, velocities, acceleration, deceleration, battery operating temperatures, thermal conditions, charging duration, number of charging/discharging cycles, energy requirements from various components, parking locations, etc. The external operational data 192 being compiled from one or more EVs enables the computational models 181A-n to be trained with "crowd sourced" data. It is to be appreciated that while AI component 180 is presented as being located on the EV 101, per FIG. 1, the AI component 180 can also be remotely located, for example, the AI component 180 can be located in the cloud.

In an embodiment, the AI component 180 can utilize the one or more computational models 181A-n to assess one or more modes of physical or chemical degradation occurring in the HVB 110 and/or LVB 112, and based thereon, make a determination regarding an operating condition (e.g., acceleration, braking, charging/discharging, thermal operation) and further based thereon, initiate one or more actions (e.g., corrective operations 168A-n) to be utilized to mitigate/prevent further degradation resulting from the specific operating condition. In another embodiment, one or more computational models 181A-n can provide estimations of the remaining useful lifetime (RUL) of a battery module 111A-n (e.g., via linear regression), which for example, can be utilized to determine a replacement schedule for the module (e.g., by schedule component 182).

In an embodiment, the external operational data 192 can be generated from EVs having vehicle components both the same and different as respective vehicle components 142A-n located on EV 101. The AI component 180 can be configured to review operation of EV 101 in a situation where one of the different components is being utilized. For example, the AI component 180 can make a determination if a component being utilized on another EV, but not currently being used on the EV 101, could improve operational performance of the EV 101, e.g., does the other component have potential to reduce degradation of modules 111A-n and 113A-n if utilized on EV 101? AI component 180 can perform a cost-benefit analysis and, in response to a determination that it would be advantageous to replace a current component with the other component, a time to replace the component can be scheduled with a dealer (e.g., by schedule component 182). In an embodiment, the replacement component can be a module that is operationally more efficient and degrades at a slower rate than the current component (e.g., module).

VCU 160 can include a computer processor 183 and memory 184 to facilitate respective operation of the respective VCU 160 system components, and/or the components can be computer instructions, codes, product, etc., executable by the computer processor 183, and stored in memory 184, as required to facilitate the various embodiments presented herein. The respective components included in the VCU 160 can be communicatively coupled by any suitable connection, e.g., a bus (a CAN bus, a LIN bus), wireless technology, and the like. The respective components, etc., included in the VCU 160 can be respectively configured to generate the VCU data 161 regarding respective operation of the components, e.g., operational constraints, alarms, operational data, etc. The VCU data 161 can be stored and operated on locally, e.g., in memory 184 and by processor 183, as well as transmitted across the system 100 for analysis, storage, review, etc., by other components located therein or external devices.

As previously mentioned, VCU 160 can further include an antenna 187 communicatively coupled to the I/O component 186, enabling the various components onboard the EV to communicate with external devices, such as the UE 196 via respective signals 189. Data 198 can be transmitted to/received from an external device (e.g., UE 196) to facilitate operation of the system 100.

As further shown in FIG. 1, a variety of instructions 199A-n can be generated by the respective components forming system 100 and external systems 196, to facilitate various operations presented herein. For example, an instruction 199A can be generated by the VCU 160 and transmitted to the battery system 105, instructing the battery operation component 120 to disconnect a first subset of the modules 111A-n, while a second subset of modules are to remain connected to provision power to one or more of the vehicle components 142A-n.

It is to be appreciated that a plethora of data, information, measurements, etc., can be generated by the EV 101 and respective onboard components, as well as external data, from remote systems and devices 196. Accordingly, when a component is presented and mention made of data, information, etc., that the component can generate and/or utilize, the data and information is not limited to the data examples associated with the description of the component but can include data, information, etc., from across the EV 101 and the remote systems 196, such as, in a non-limiting list, any of sensor data 131A-n, digital modules 132A-n, battery data 138, system data 155, VCU data 161, user profiles 170A-n, routes 173A-n, user input data 195, external data 198, corrective operation(s) 168A-n, operational data 167A-n, data utilized and generated by degradation models 164A-n, data generated and utilized by the computational models 181A-n, instructions 199A-n, manufacturer and third party data 192, alarms 177A-n, and the like.

High Level Overview of Mitigation of Degradation.

A variety of interactions and sequence of operations can occur between the respective components in system 100. In an example sequence, the EV is being driven with measurements (sensor data 131A-n) being generated by sensors 130A-n, which are combined at the BMS 115, via the battery monitoring component 125, to form battery data 138. The battery data 138 can be forwarded to the degradation component 163. At the same time the vehicle operation component 166 can be monitoring operation of one or more components (e.g., acceleration system 147, braking system 146) and generates operational data 167A-n which is transmitted to the degradation component 163. The degradation component 163 can make a determination that the EV is being driven in a manner that causes unnecessary degradation of the modules 111A-n. E.g., while each particular moment of driving is not causing module degradation, overall, the EV is being driven in a manner causing avoidable degradation of the modules 111A-n. The degradation component 163 can inform the vehicle operation component 166 that unnecessary degradation is occurring, whereupon the vehicle operation component 166 instructs the alarm component 176 to generate and present an alarm 177A on the HMI 190. The alarm 177A can be accompanied by one or more recommendations/corrective operations 168A-n to mitigate the module degradation, wherein the route component 172 can provide alternative routes 173A-n, the AI component 180 can review the current driving conditions, predictions of the future degradation of the modules based upon the models (e.g., digital modules 132A-n, computational models 181A-n, degradation models 164A-n), etc., and also determine corrective operations 168A-n. If the operator does not comply (or does not substantially comply) with the corrective operations 168A-n and alarm 177F, a second alarm 177B can be generated instructing the operator that operation of the EV is going to be limited to reduce module degradation. The vehicle operation component 166 can communicate with the EV system 140 to identify the various vehicle components 142A-n that are currently operating, their "value" (e.g., a high or low value component), and the power required for operation. Based upon such factors as the remaining charge available (e.g., provided by BMS 115) from the HVB 110/LVB 112, the route, final destination, the weather, availability of a recharge prior to or at the destination, desired time of arrival, etc., the vehicle operation component 166 can determine operation of which vehicle components 142A-n must be sustained and/or adjusted and operation of which can be terminated, with the respective power requirements of each vehicle component 142A-n, e.g., high voltage, low voltage, etc. The degradation component 163 can instruct the BMS 115 to identify how many modules 111A-n and/or 113A-n will be required for the corrective operation 168A-n. The degradation component 163 (e.g., using the battery data 138) can categorize the respective modules 111A-n from poor SOC to good SOC, wherein poor SOC indicates the module has the lowest determined SOC (e.g., in an example scenario, the lowest determined SOC was 73%) and a good SOC indicates a module has the highest determined SOC (e.g., 94% SOC). The vehicle operation component 166 in conjunction with, for example, the degradation component 163 and the BMS 115, can select modules to provision power to maintain operation of the selected vehicle components 142A-n, wherein selection of the modules begins with selecting the module having the lowest SOC and then respectively adding the module with the next lowest SOC, and the next lowest SOC, etc., until the required amount of charge is met by the collection of selected modules (e.g., a first subset of modules in modules 111A-n), with the first subset of modules being connected (e.g., to circuit 220, as further described herein) to provide the charge. The modules that were not selected to provide charge (a second subset of modules in the modules 111A-n), which, in the example scenario will be the modules having the highest, or substantially highest, SOC can be disconnected (e.g., from circuit 220, as further described herein) from providing charge. The battery operation component 120 maintains connection of the first subset of modules 111A-n modules while disconnecting (via the respective switchable connectors 230A-n opening) the second subset of modules 111A-n.

Owing to the operator not having the ability to override the limited selection of components (e.g., operation of the AC is terminated), the limited operation is maintained and the user profiles 170A-n of the driver is updated to indicate that the VCU 160 had to take control of the EV 101. A depiction of the modules 111A-n and/or 113A-n can be presented on the HMI 190 indicating which modules 111A-n and/or 113A-n are currently being utilized to power the EV 101, what vehicle components 142A-n they are powering, those which are not, and the respective SOH, SOC, etc., of each module 111A-n and/or 113A-n. If necessary, replacement of any of modules 111A-n and/or 113A-n can be scheduled (e.g., by schedule component 182). Accordingly, the various embodiments presented herein can isolate modules to prevent degraded modules from deleteriously affecting healthier modules; limit operation of EV components to enable modules to be isolated from use; present information regarding the SOH and SOC of the modules, module location, and whether specific modules are being utilized to provision power to the EV; maintain user profiles with driving history and effect on module degradation, whether the user enacted the override function; further operation to mitigate module degradation, incl., route selection, autonomous parking, etc.; along with scheduling replacement of the modules.

In an embodiment, the operator of EV 101 may simply want to know what the operating condition of the one or modules currently is. For example, the EV may be parked in a home garage, and the operator wishes to view the condition of the modules (e.g., modules 111A-n and/or 113A-n). Measurements (sensor data 131A-n) can be generated by sensors 130A-n, which are combined at the BMS 115, via the battery monitoring component 125, to generate battery data 138. The battery data 138 can be forwarded to the VCU 160. The VCU 160 can utilize HMI 190 to present a representation of the modules, with the respective location of the modules and pertinent battery data 138 (e.g., SOH, SOC, DOD, and the like) presented therewith. Per the various embodiments presented herein, the operator can further select one or more modules for replacement and schedule the replacement (e.g., via schedule component 182).

Selectable Modules

FIGS. 2A and 2B illustrate an example system 200 that can be utilized to distribute electrical energy from a battery (e.g., HVB 110) and LVB 112, vehicle components 142A-n, motor 145, etc., located on EV 101. FIG. 2A presents a top-down view in direction y (per FIG. 1) and FIG. 2B presents a sectional side view. As previously described, a HVB 110 can be formed from a set of modules 111A-n, whereby the set of modules 111A-n are interconnected by electrical circuit 220. A LVB 112 with modules 113A-n can be similarly connected by an electrical circuit 220 and operate per the following.

FIG. 2B illustrates sensors 130A-n respectively located in respective modules 111A-n, e.g., sensor 130A is measuring one or more operational conditions of module F7, sensor 130B is measuring one or more operational conditions of module F8, sensor 130n is measuring one or more operational conditions of module F9. The sensors 130A-n can be providing sensor data 131A-n, via sensor circuit 240, to battery monitoring component 125. As previously mentioned, the sensor data 131A-n can be utilized by various components presented in system 100 to determine an operational condition of one or more modules 111A-n and, based thereon, control operation (e.g., via battery operation component 120) of the modules 111A-n regarding provision of electrical power to one or more vehicle components 142A-n.

As shown in FIGS. 2A and 2B, the electrical circuit 220 includes a switch (relay) 222 configured to be operated by the BMS 115. For charging of the modules 111A-n, the BMS 115 controls the switch 222 to be in a first position connecting the electrical circuit 220 to circuit/cable 117 and CS 116. When discharging the modules 111A-n, the BMS 115 controls the switch 222 to be in a second position connecting the electrical circuit 220 to circuitry for charging the modules 113A-n of LVB 112 and the vehicle components 142A-n.

Each module 111A-n can be connected to the electrical circuit 220 by a respective connector 230A-n, connected to a module terminal 235A-n on each module 111A-n. Each of the connectors 230A-n are switchable (e.g., relays) and can be utilized to respectively connect or disconnect respective modules 111A-n to the electrical circuit 220. For example, module F7 can be connected to the electrical circuit 220 by connector 230A, module F8 can be connected to the electrical circuit 220 by connector 230B, module F9 can be connected to the electrical circuit 220 by connector 230n. As shown in FIG. 2B, each connector 230A-n comprises a switch, as depicted in the example scenario presented in FIG. 2B, connector 230A is in a "C"-closed position with module F7 connected to the electrical circuit 220, connector 230B is in an "O"-open position causing module F8 disconnected/isolated from the electrical circuit 220, and connector 230n is in an "O"-open position causing module F9 to also be disconnected/isolated from the electrical circuit 220. Hence, battery F7 can be considered to be in a first subset of battery modules in modules 111A-n providing power one or more components in system 100, and batteries F8 and F9 can be considered to be in a second subset of battery modules that are currently disconnected/isolated from providing power to one or more components in system 100. The respective switch position of the respective connectors 230A-n can be controlled by the battery operation component 120, wherein battery operation component 120 is connected to the respective connectors 230A-n via switching circuit 225. The battery operation component 120 can transmit switch signals 250A-n via switch control circuit 225 to the connectors 230A-n. In an example scenario, battery operation component 120 has transmitted a switch signal 250A to connector 230A instructing the connector 230A to be in a closed position to facilitate electrical connection of the module F7 to the electrical circuit 220, and a switch signal 250n to connector 230n instructing the connector 230n to be in an open position to facilitate disconnection of the module F9 to the electrical circuit 220, e.g., the module F9 has been selected to not provide electrical power to vehicle components 142A-n. As shown in FIG. 2B, the battery operation component 120 can generate switch signals 250A-n in response to module selection instructions 199A-n received from other components in system 100 (such as VCU 160, degradation component 163, etc.), wherein the module selection instructions 199A-n can include switching instructions for the respective connectors 230A-n and the modules 111A-n respectively connected thereto.

As shown in FIGS. 2A and 2B, the electrical circuit 220 includes a switch (relay) 222 configured to be operated by the BMS 115. For charging of the modules 111A-n, the BMS 115 controls the switch 222 to be in a first position connecting the electrical circuit 220 to circuit/cable 117 and CS 116. Further, during charging, the connectors 230A-n are controlled by the battery operation component 120 to be in the closed position to connect the modules 111A-n to the CS 116. When discharging the modules 111A-n, the BMS 115 controls the switch 222 to be in a second position connecting the electrical circuit 220 to circuitry for charging the modules 113A-n of LVB 112 and the vehicle components 142A-n, while connectors 230A-n are in respective open/closed positions as required to connect/disconnect selected modules 111A-n with the electrical circuit 220.

Turning to FIGS. 3 and 4, FIG. 3 illustrates an example system 300 that can be utilized to distribute electrical energy from a battery (e.g., HVB 110, LVB 112) to a component located on an EV. FIG. 4 illustrates an example system 400 that can be utilized to distribute electrical energy from a battery (e.g., HVB 110, LVB 112) to a component located on an EV. FIG. 4 can be read in conjunction with FIG. 3. In the examples depicted in FIGS. 3 and 4, HVB 110 is connected to a motor 145, but it is to be appreciated that concepts presented in FIGS. 3 and 4 can be directed to a battery pack being connected to any vehicle component 142A-n, incl. motor 145.

As described herein, one or more modules 111A-n and 113A-n can be in varying states of degradation in comparison with other modules combined to respectively form HVB 110 and LVB 112. FIG. 3 illustrates an example scenario of power distribution between a battery (e.g., HVB 110) and any of LVB 112, vehicle components 142A-n, motor 145, etc., located on EV 101. As shown in FIG. 3, the BMS 115 (e.g., utilizing battery operation component 120) can be configured to control flow of electrical energy from HVB 110 to motor 145. An electrical circuit 220 connects the respective modules 111A-n forming HVB 110 to the power cable 114. In system 300, connections between circuit 220 and the modules 111A-n are via non-switchable connectors 330A-n, as indicated by all of the connections 330A-n being in a closed position. Accordingly, the modules 111A-n are all connected to provision power, even though, as illustrated, some modules may be assessed to be in a state of severe degradation and others are in an anticipated/acceptable state of degradation. Hence, the modules (e.g., A2, C1, F9, etc.) having a severe state of degradation can be negatively affecting the operational health of the modules in an acceptable state of degradation (e.g., A1, C4, E7, etc.), which can lead to the overall operational health of the HVB 110 to be degraded.

FIG. 4 illustrates an example scenario of power distribution between a battery (e.g., HVB 110) and any of LVB 112, vehicle components 142A-n, motor 145, etc., located on EV 101, wherein, unlike the non-switchable connectors 330A-n presented in FIG. 3, switchable connectors 230A-n enable selection of modules for use and to not use. As shown in FIG. 4, the BMS 115 can be configured to control flow of electrical energy from a HVB 110 to a motor 145. The electrical circuit 220 connects the respective modules 111A-n forming HVB 110 to the power cable 114. In comparison with FIG. 3, as shown in FIG. 4, the BMS 115 includes a battery operation component 120, which as previously described and further described herein, the battery operation component 120 can be configured to control which respective modules in the modules 111A-n are to provide electrical energy to the motor 145 and other vehicle components 142A-n. The battery operation component 120 can be configured to control operation of the switchable connectors 230A-n thereby selecting which modules 111A-n are to provision power to the motor 145, and other vehicle components 142A-n. In an example operation, when a respective switchable connector in the set of switchable connectors 230A-n is switched to a "closed" position, as indicated in FIG. 4, the respective module (e.g., A2, B5, E2, F9, etc.) in the group of modules 111A-n is connected to the electrical circuit 220, and accordingly, the respective module in the group of modules 111A-n is connected electrically to the motor 145 or other vehicle components 142A-n, and provides electrical energy thereto. In another example operation, when a respective switchable connector in the set of switchable connectors 230A-n is in an "open" position, the respective module 111A-n (e.g., A1, C4, E6, F6, etc.) is disconnected from the electrical circuit 220 by its associated switchable connector 230A-n being in the open position. Hence, the battery operation component 120 can be configured to control which modules in the group of modules 111A-n are connected to the circuit 220 to provide electrical energy to the motor 145, and other vehicle components 142A-n. In an embodiment, as described herein, selection of which modules 111A-n are connected and providing power to the motor 145, and other vehicle components 142A-n, can be a function of a respective degree of degradation the respective module in the modules 111A-n. As previously mentioned, VCU 160 components (such as the degradation component 163, AI component 180, and suchlike) can be configured to determine a degree of degradation each respective module in the group of modules 111A-n was previously at, is currently at, or will be at in the future.

As indicated by the respective shading applied to respective modules 111A-n depicted in FIGS. 3 and 4, the modules 111A-n are in various states of degradation. As shown, a first subset of modules have an anticipated/acceptable degree of degradation (the unshaded modules, e.g., modules A1, A3, A4, A5, A7, A8, A9, B1, B2, B4 . . . F7. The terms "anticipated"/"acceptable" degree of degradation are used in this example scenario to imply the respective modules have a degree of degradation (e.g., from (a) charge cycle fading and (b) calendar ageing) as would be expected for a module that has been in operation for a duration of time that respective module has been operational.

As further shown, a second subset of modules are in a "moderate state of degradation", e.g., modules A6, B3, D6, and F3. Furthermore, as shown, a third subset of modules are in a "severe state of degradation", e.g., modules A2, B5, B7, C1, E2, E5, E9, F8, and F9. It is to be appreciated that the terms "anticipated degree of degradation", "moderate state of degradation", and "severe state of degradation" are to convey the various embodiments and concepts presented herein, and accordingly, their respective use is arbitrary. Any suitable nomenclature can be utilized, e.g., a first state of degradation, a second state of degradation, a third state of degradation, an $n^{th}$ state of degradation. Furthermore, the respective degree of degradation for a first module in the set of modules 111A-n can be relative to a degree of degradation of a second module in the set of modules 111A-n. In an embodiment, the "anticipated degree of degradation" can be a superior condition to both the "moderate state of degradation" and the "severe state of degradation", while the "severe state of degradation" is inferior to both the "anticipated degree of degradation" and the "moderate state of degradation", such that in terms of degree of degradation, where, here, a greater magnitude indicates a worse state of module degradation: "severe state of degradation">"moderate state of degradation">"anticipated degree of degradation".

In an embodiment, the degradation component 163 can apply a threshold level 165A-n of degradation against which the respective degrees of degradation are determined. In an embodiment, the threshold level can be based upon a degree of degradation expected/anticipated/acceptable for a module that has been in operation for the period of time that the respective module has been operational, e.g., the degradation threshold is received data 192 from the EV manufacturer/battery manufacturer. Accordingly, any modules that are determined to be in a state of degradation equal to, or less than the acceptable degree of degradation, can be labelled by the degradation component 163 as modules having an acceptable degree of degradation. Further, any modules that are determined to be in a state of degradation greater than the expected degree of degradation, the degradation component 163 can be configured to label those modules as being in a degraded state. The degree of degradation can be determined based upon a respective magnitude of degradation, wherein, for example, those modules having a level of degradation only moderately worse than the anticipated degree of degradation can be labelled "moderately degraded" and those have a much greater degree of degradation than that anticipated can be labelled "severely degraded".

In another embodiment, the respective degree of degradation can be quantified based upon the respective level of degradation compared with the other modules 111A-n in the HVB 110. Accordingly, by determining the respective degradation of each module in the modules 111A-n, a range of degradation can be determined. In an embodiment, the degradation component 163 can be configured to control selection of modules to power the one or more vehicle components 142A-n, wherein the degradation component 163 can be configured to switch off (via battery operation component 120 and switchable connectors 230A-n), for example, 20% of the total number of modules in 111A-n. Hence, the degree of degradation equating to 20% of the modules is determined, and the remaining 80% of modules in the modules 111A-n are utilized to charge the motor 145.

By selecting which modules in the modules 111A-n are utilized to supply power to the vehicle components 142A-n as a function of determined degradation, the degradation component 163 is applying a load balancing operation to the modules 111A-n so as to ensure that those modules having the worse state/higher states of degradation are utilized to power the motor 145 and vehicle components 142A-n, and accordingly, those modules will effectively be sacrificed while the modules having a lesser degree of degradation are not utilized to provide charge to the motor 145, etc., and those modules are saved (e.g., undergo a lesser amount of charging/discharging cycles/electrical transition than the sacrificed modules). Accordingly, the sacrificed modules can be identified, and during a subsequent servicing of the EV, those sacrificed modules can be removed and replaced with new modules. By employing an approach of utilizing more degraded modules and saving the lesser degraded modules, the operational lifetime of the lesser degraded modules can be extended, and the modules exhibiting a higher degree of degradation can be sacrificed and replaced. Hence, fewer modules in the modules 111A-n have to be replaced and the overall health of the collection of modules 111A-n is extended.

Figure 5:
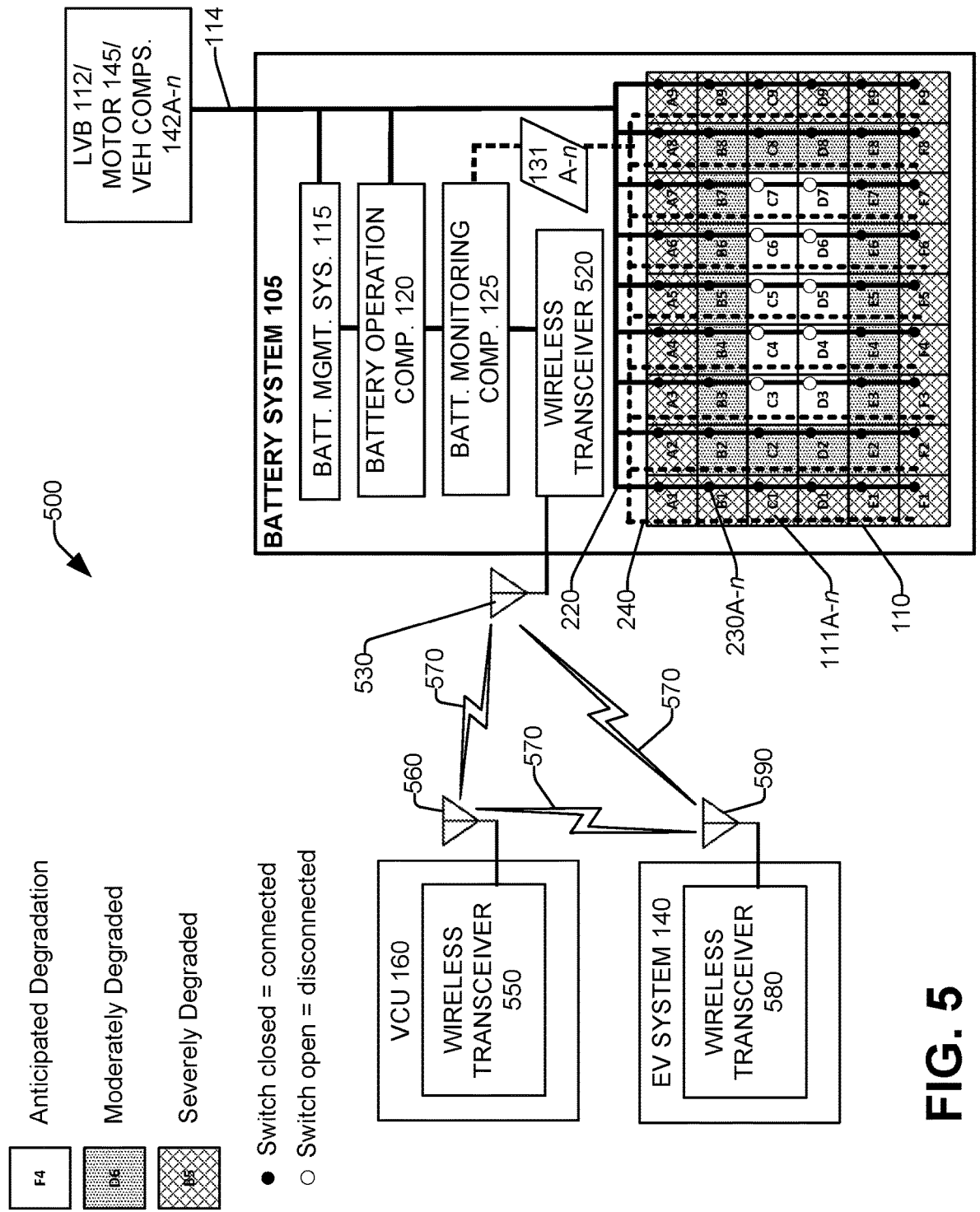
FIG. 5 is a block diagram representation of an example battery system utilized to prevent degradation of one or more battery modules onboard an EV, in accordance with various aspects and implementations of the subject disclosure.

FIG. 5 illustrates a system 500 presenting an example scenario of power distribution between a battery (e.g., HVB 110) and any of LVB 112, vehicle components 142A-n, motor 145, etc., located on EV 101. A group of modules 111A-n are connected via an electrical circuit 220 to any of a LV 112 (e.g., via OS118 not shown), a motor 145 or vehicle components 142A-n (via cable 114). Operating condition of the modules can be via sensors 130A-n (not shown in FIG. 5) and sensor data 131A-n transmitted between the sensors and the battery monitoring component 125, as previously mentioned.

As further mentioned, the location of a first module with respect to other modules in a battery can cause degradation of the first module at a rate that is greater than a rate of degradation experienced by the other modules. For example, an exterior module may be exposed to a temperature during operation that causes the module to operate at a temperature above/below an optimal temperature (e.g., during winter, during a hot climate, and the like), accordingly, over an extended period of use, the exterior module undergoes degradation at a greater rate than the rate of degradation experienced by a module located at the center of the battery pack. As shown in FIG. 5, modules (e.g., A1-A9, B1, B9, C1, C9, D1, D9, E1, E9, F1-F9) located on the outside of a battery pack are assessed (e.g., by battery operation component 120, degradation component 163) to be in a severely depleted state, modules (e.g., B2-B8, C2, C8, D2, D8, E2-E8) further to the center of the battery pack are assessed (e.g., by battery operation component 120, degradation component 163) to be in a moderately depleted state, and modules (e.g., C3-C7, D3-D7) at the center of the battery pack are assessed (e.g., by degradation component 163, battery operation component 120) to be in an acceptable state of degradation. Accordingly, to minimize the degradation of the inner modules, the battery operation component 120 (per an instruction 199A from a VCU 160 component) can be configured to isolate a first subset of modules, modules C3-C7 and D3-D7, from providing energy to vehicle components 142A-n by opening switchable connectors 230A-n connected to modules C3-C7 and D3-D7, as shown. Power to vehicle components 142A-n is provided by the second subset of modules that remain connected to the circuit 220.

As previously mentioned, various systems and components onboard EV 101 can be communicatively coupled, e.g., via a hardwired circuit or wirelessly. As shown in FIG. 5, battery system 105 can include a wireless transceiver 520 (e.g., incorporated into I/O component 137) and an antenna 530. As further shown, the VCU 160 can include a wireless transceiver 550 (e.g., incorporated into I/O component 186) and an antenna 560, and furthermore, the EV system 140 can include a transceiver 580 (e.g., incorporated into I/O component 152) and an antenna 590. Implementation of the wireless transceivers 520, 550, and 580, enables data (e.g., battery data 138, sensor data 131A-n, system data 155, instructions 199A-n, external data 198, EV manufacturer data 192, operational data 167A-n, and the like) to be transmitted wirelessly between components located on the EV 101, via a signal 570, enabling wireless communications between the battery system 105, EV system 140, and the VCU 160 (and external systems/devices 196). While not shown, any component located onboard EV 101 can include a wireless transceiver (e.g., sensors 130A-n) to facilitate transmission of data between one or more components.

Depiction of Modules on HMI & Replacement Scheduling

Figure 6:
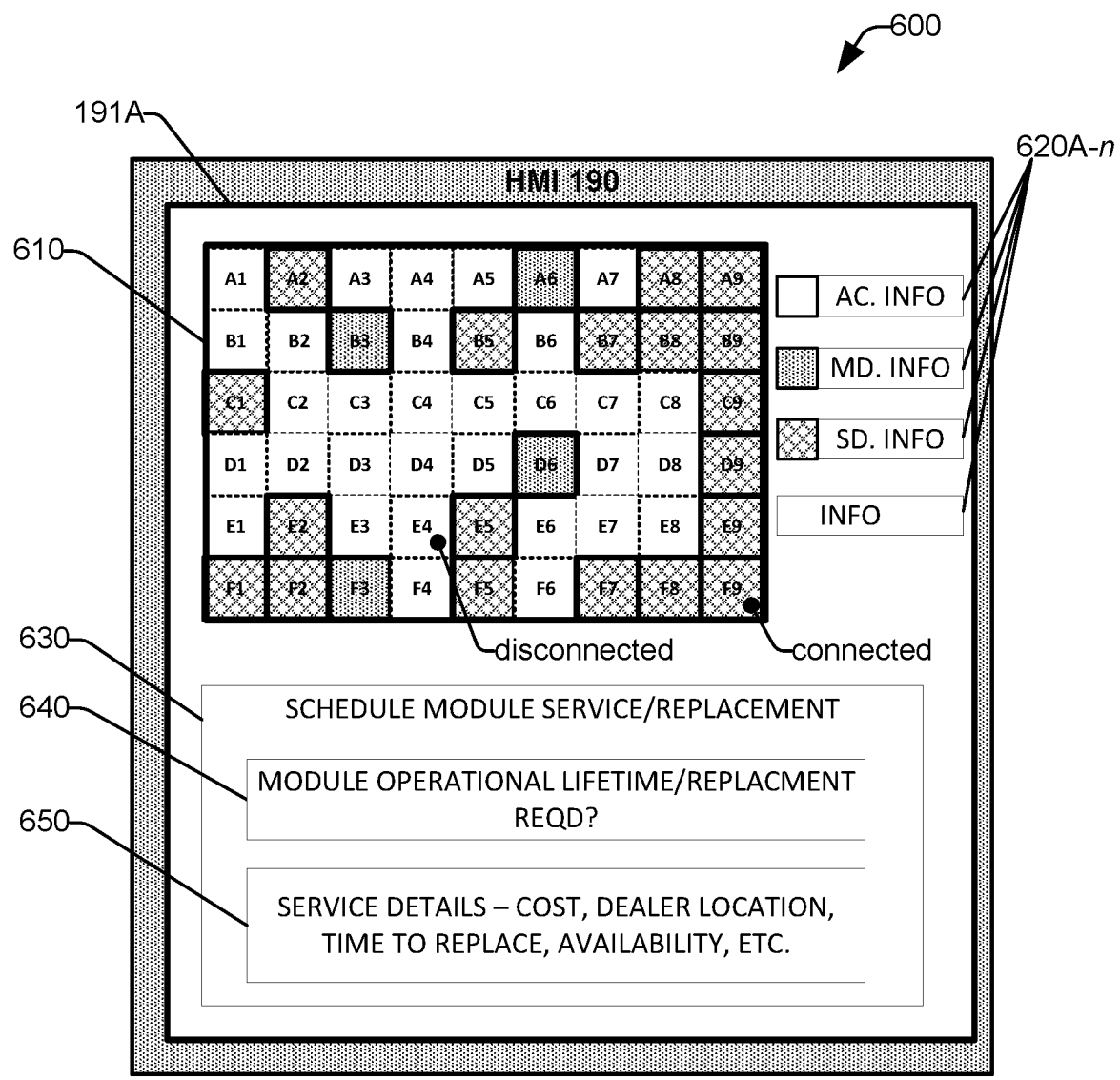
FIG. 6 is a block diagram representation of example components related to presentation of a battery system related to preventing degradation of one or more modules combined to form a battery onboard an EV, in accordance with various aspects and implementations of the subject disclosure.

As previously mentioned, a collection of screens 191A-n can be presented on the HMI 190. FIG. 6 illustrates system 600 with an example representation of a screen 191A being presented on HMI 190. In an embodiment, screen 191A can be configured to present a depiction 610 of a battery pack (e.g., HVB 110) with the respective location of each module 111A-n identified, in conjunction with operational information 620A-n for one or more of the modules, e.g., a current operating condition (SOC, SOH, temperature, etc.) of the respective module. In the example depiction, module A1 is in an acceptable SOH, while module A6 is in a moderate state of degradation, and module A2 is in a severe state of degradation. Further, an indication of which modules were previously, currently being, and planned to be utilized can be shown on depiction 610. For example, a first subset of modules including the outer modules are currently connected (as depicted by the bold line) along with modules in a moderate or severely degraded state (e.g., B3, B5, D6, etc.), while a second subset of modules B2, B4, B6, B8, C2-C8, etc., are disconnected, e.g., from circuit 220 (as depicted by the hashed line). Any data or information can be presented in the operational information 620A-n, such as battery data 138, system data 155, operational data 167, external data 198, etc., with interactive components (e.g., on screen buttons, slide controls, audible instructions, and the like) enabling selection of required data to be presented on HMI 190 and/or screens 191A-n.

In an embodiment, scheduling information regarding module replacement and the like can be presented on screens 191A-n, e.g., replacement and schedule information 630 can be presented, along with information 640 regarding whether a module should be replaced (e.g., per anticipated operational time remaining for a module before it should be replaced, as determined by AI component 180 and/or degradation component 163), and pertinent replacement details 650 such as cost to replace the module, location of service center, time required to replace, availability of replacement/service, etc. By displaying the modules 111A-n, operational health of the modules, replacement and scheduling information, etc., it is easy for a person (EV operator, service engineer, mechanic, and the like) to view the representation and make a determination as to whether, when, and/or how one or more modules 111A-n should be replaced. The replacement and schedule information 630, replacement information 640, and replacement details 650 can be generated by schedule component 182 based upon any information generated by, or received by, the schedule component 182.

Route Information

Figure 7:
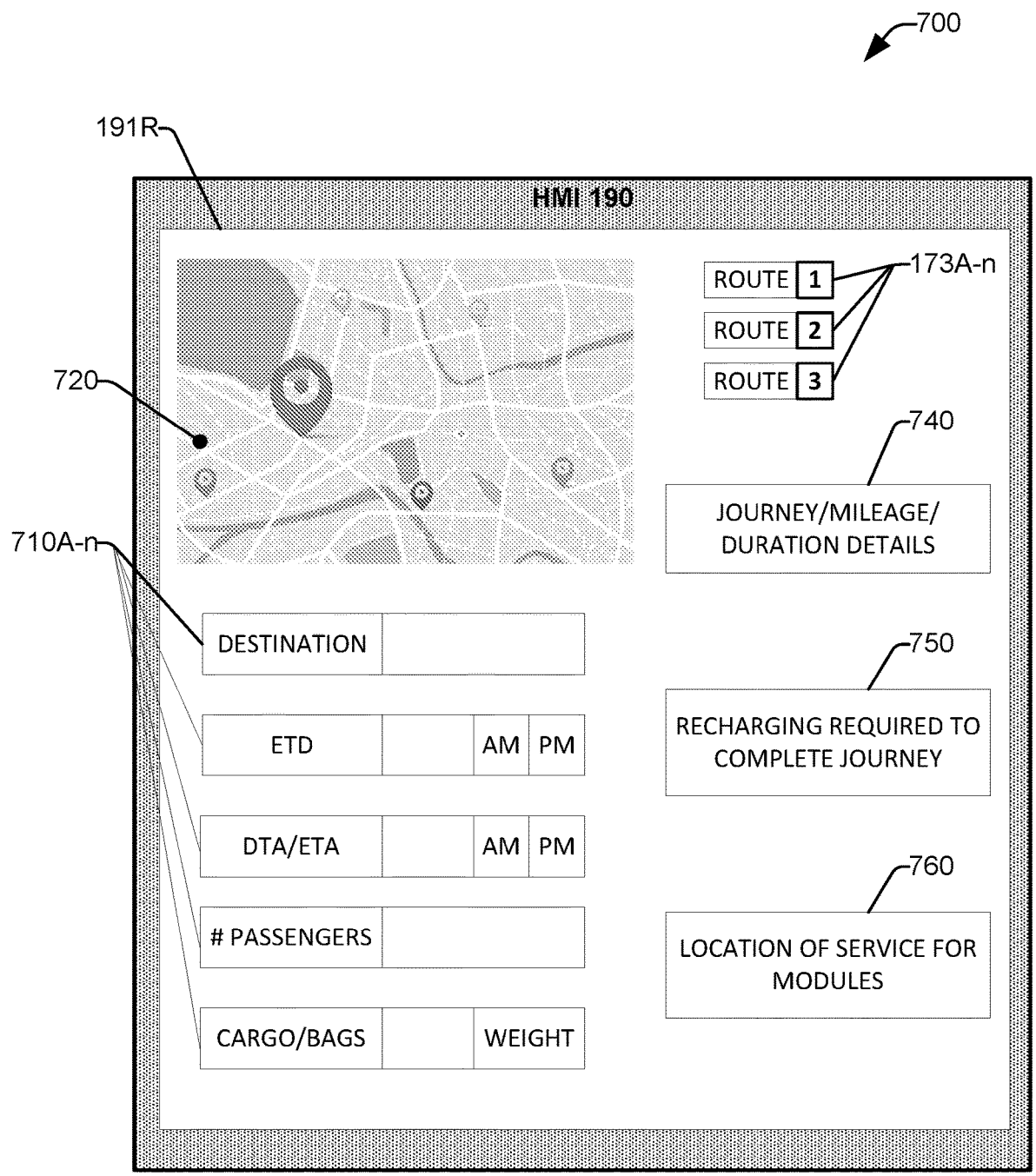
FIG. 7 is a block diagram representation of example components related to presentation of a route to prevent degradation of one or more modules combined to form a battery onboard an EV, in accordance with various aspects and implementations of the subject disclosure.

Turning to FIG. 7, system 700, in an example embodiment, a screen 191R (in screens 191A-n) can be presented on HMI 190, wherein the screen 191R facilitates entry of route information. Via screen 191R, an operator of the EV 101 can enter journey information 710A-n, including such information as destination, desired time of arrival of a route to be taken, start time of journey, number of passengers in EV, number/weight of bags or cargo, and the like, wherein information can be compiled in route data 173A-n. As the information is being submitted, in an embodiment, a map 720 can be displayed and updated with the route information entered. Further, a series of routes 173A-n can be identified (e.g., by route component 172, AI component 180, vehicle operation component 166, etc.), with route supplemental information 740, where the routes can be based on such criteria as shortest route, quickest route, etc., as are typically presented during planning of a journey. Further, the routes 173A-n can also include one or more routes identified as having a negligible degradative effect on the operational health of modules 111A-n, wherein these routes can be determined by the route component 172, AI component 180, degradation component 163, vehicle operation component 166, etc. For example, a series of routes 173A-n can be generated and ranked in terms of time to complete journey, distance, etc., as well as by which routes will create the least module degradation through to those that will create the most (e.g., unnecessary) module degradation, wherein the rankings, route information, etc., can be presented on screen 191R. Also, a determination can be made (e.g., by the AI component 180, vehicle operation component 166, degradation component 163) whether a battery recharging operation(s) 750 will be required to complete the journey, and, further, location of one or more service centers 760 can be presented enabling the operator to plan their journey accordingly. In an embodiment, the AI component 180 can determine that at least one module 111A-n requires replacement, and the operator can make a determination (e.g., aided by the schedule component 182) as to whether to schedule a service prior to undertaking the journey or while undertaking the journey, wherein module service can be scheduled on example screen 191A presented on FIG. 6. Accordingly, information entered via the HMI 190 can be stored (e.g., in route data 173A-n) and subsequently utilized (e.g., by components in the VCU 160) to assist the operator undertake the journey when underway, e.g., to adjust for weather, traffic, roadworks, etc.

Alarms, EV Control, and Override

Figure 8:
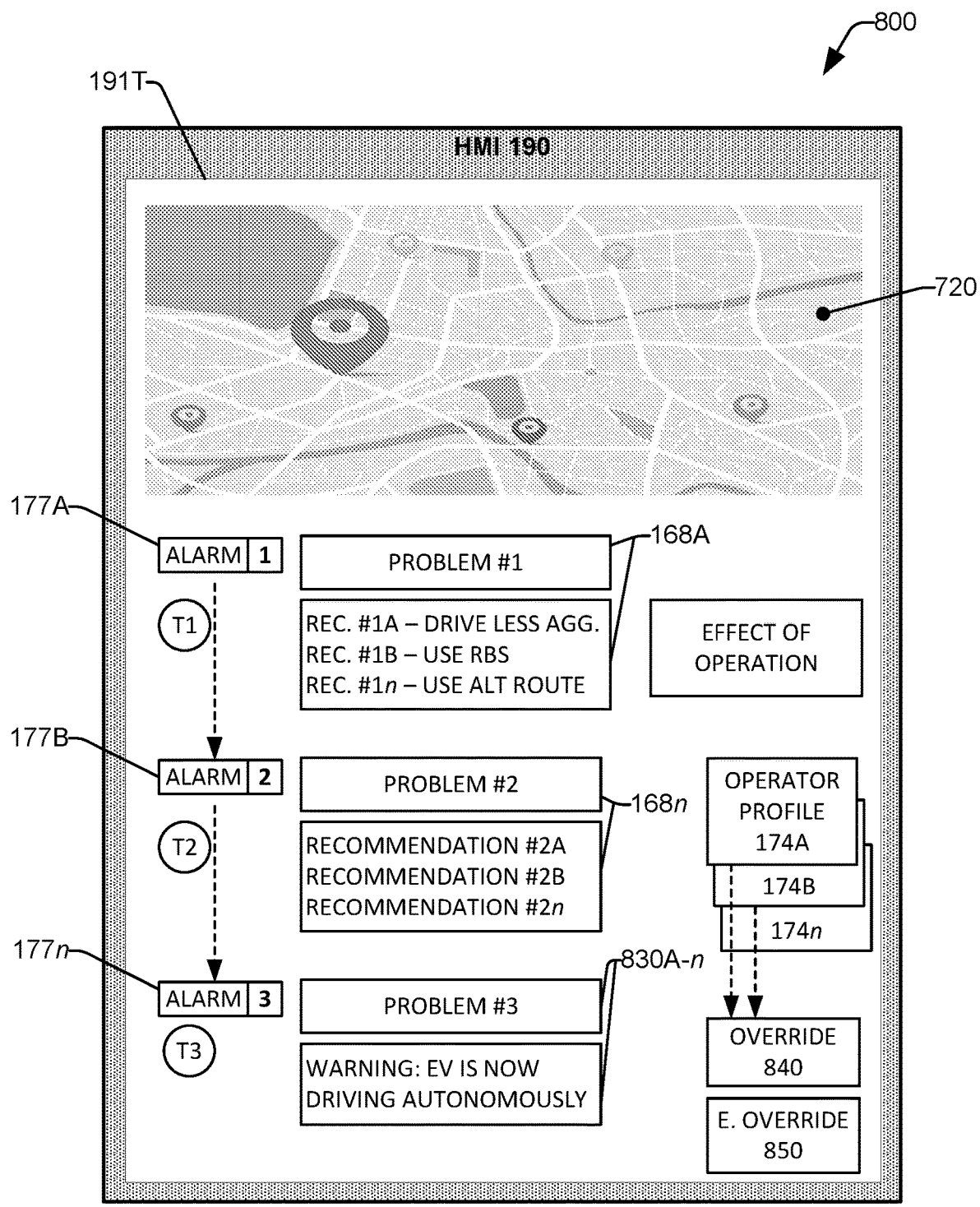
FIG. 8 is a block diagram representation of example components related to presentation of alarms and corrective operations to prevent degradation of one or more modules combined to form a battery onboard an EV, in accordance with various aspects and implementations of the subject disclosure.

As mentioned, a series of alarms 177A-n can be generated (e.g., to alert the operator) regarding prior, current, and future operation of the EV with regard to operational health of the one or more modules 111A-n. FIG. 8, system 800, illustrates an example representation of a screen 191T with a first alarm 177A presented, wherein vehicle operation component 166 (in conjunction with any of AI component 180, degradation component 163, sensor data 131A-n, battery data 138, system data 155, VCU data 161, external data 198, routing data 173A-n, etc.) has determined that the EV is being operated in a manner that can lead to unnecessary degradation of the operational health of one or more modules 111A-n, e.g., the EV is being driven in an aggressive driving manner (e.g., fast acceleration, heavy braking). Accompanying the first alarm 177A, the identified problem in operating the EV is presented along with one or more recommended corrective operations 168A-n presented to assist the operator in operating the EV in a manner to reduce degradation of the modules 111A-n. In an example, a first corrective operation 168A can be presented recommending that the operator drives in a less aggressive manner to mitigate unnecessary degradation in the operational health of the one or more modules 111A-n, e.g., "accelerate slowly", a second corrective operation 168B is "utilize the RBS system", a third corrective operation 168C is "use an alternative route", and the like. Any of the recommended corrective operation can be presented on the map 720, e.g., an alternative route 173C in conjunction with a current route 173A giving rise to the problem.

The first alarm 177A can be presented at time T1. Subsequent to the presentation of first alarm 177A, operation of the EV can be monitored (e.g., by vehicle operation component 166) to determine whether the operator has responded to the first alarm 177A and any of the corrective operations 168A has been adopted. In an embodiment, in the event of a determination that the operator is complying with the corrective operation 168A, the first alarm 177A can be canceled.

In the event of a determination that the operator has not complied with the corrective operation 168A and is still operating the EV in a manner causing unnecessary degradation of the modules 111A-n, a second alarm 177n and a second corrective operation(s) 168B can be presented encouraging the operator to drive less aggressively, etc., wherein the second alarm 177B/second corrective operation(s) 168n can provide supplemental information to the operator regarding the damage their driving style could be causing to any of the modules 111A-n.

The second alarm 177B can be presented at time T2. In the event of a determination that the operator has not complied with the recommended corrective operation(s) 168n and, subsequent to time T2, is still operating the EV in a manner causing unnecessary degradation of the modules 111A-n, a third alarm 177n can be presented encouraging the operator to drive less aggressively, wherein the third alarm 177n can be accompanied with a first warning 830A (in a variety of available warnings 830A-n) indicating that the EV is going to take control of one or more operations to mitigate degradation of the one or more modules 111A-n. For example, in an embodiment, the operator may have entered a destination into the screen 191B, wherein, the vehicle operation component 166 can be configured to take over total control of the driving operation(s), and the EV will be driven autonomously to the entered destination (ref FIG. 7). In another embodiment, the vehicle operation component 166 can determine that with the current amount of energy available from HVB 110 and LVB 112, to ensure completion of a journey, operation of one of more vehicle components 142A-n (e.g., having a low operational value) is to be terminated, e.g., operation of a passenger compartment air conditioning unit 148 is to be terminated, the vehicle operation component 166 instructs BMS 115 to terminate sourcing energy to the air conditioning unit 148. In an embodiment, the example sequence of alarms prior to this warning being presented does not have to occur, the vehicle operation component 166 may make the determination of insufficient energy available to complete journey and warns the operator, even if the operator is driving the EV 101 in a manner that does not give rise to unnecessary degradation, that operation of the low value vehicle components 142A-n is being ceased to ensure completion of the journey.

In an embodiment, if the operator continues to operate the EV in a manner creating unnecessary degradation, a first alarm 177W can be presented on a screen 191W informing the operator that continued operation of the EV in such a manner can lead to the battery warranty 139 being invalidated. If the operator fails to heed the warning and continues to operate the EV in a manner causing unnecessary degradation, a second alarm 177X can be presented informing the operator that the battery warranty 139 has been invalidated owing to the operator's driving style.

In an embodiment, it is possible for an operator to override the operational control imposed upon the EV by the vehicle operation component 166. User profiles 170A-n can be respectively configured with an override option (also known as an override component), wherein an operator who has a profile with the override option available can disable the imposed operational control. As shown on FIG. 8, an override button 840 can be presented on the screen 191T, with the availability of the override feature based on whether the respective user profile 170A-n has the override feature available. In a further embodiment, a record of whether the override button 840 was activated can be saved in the respective user profile 170A-n. The override operation can be conducted by any suitable method(s), e.g., a password, verbal command, and the like (e.g., entered into HMI 190).

In a further embodiment, an emergency override button 850 can be presented on screen 191T. The emergency override operation can be utilized in an emergency situation. For example, a passenger has a health concern with the driver responding by driving the EV at speed to a hospital. The degradation component 163 determines the EV is being driven in a manner to cause unnecessary module degradation, the alarm component 176 presents a first alarm 177F and recommends corrective operations 168A-n. The driver can respond by selecting the emergency override button 850 which can cause the vehicle operation component 166 to take over operation of the EV and drive it in a manner to prioritize reaching the destination as quickly as possible with no concern for degradation of the modules 111A-n or 113A-n.

In another embodiment, operation of the EV can be reported to a remote device (e.g., by vehicle operation component 166 via signals 189). In an example scenario, a parent can be monitoring operation of the EV by their child and has configured a profile 170C for the child, the profile 170C can be updated with operational data 167A-n, system data 155, etc. While operating the EV, the child may be driving in a reckless manner, e.g., fast acceleration and hard braking, and various alarms 177A-n, corrective operations 168A-n, warnings 830A-n, etc., are presented on the screen 191C, which the child chooses not to comply with. As well as possibly being dangerous driving, the operation may be causing unnecessary degradation of one or more modules 111A-n. The operating conditions 167A-n of the EV can be transmitted to the remotely located parent, wherein the parent has the ability to take over one or more actions regarding operation of the EV. For example, the parent can enforce a maximum driving speed of the EV in accordance with the local driving conditions (e.g., as determined by the route component 172). In another example, the parent can enforce the EV go to fully autonomous operation by the vehicle operation component 166. Furthering the example, the parent has configured the child's profile 170C such that the override feature is not available, accordingly, the override button 840 cannot be selected (in an embodiment, it may not be presented on screen 191C) and the child now operates the EV under co-control of the parent, or the parent takes complete control. The corrective operating condition(s) 168A-n can be enforced by the parent to mitigate any unnecessary degradation of the modules 111A-n. Parental control can be subsequently relinquished to the child. In an embodiment, the parent can be monitoring the operation of the EV by the child via a software application operating on a remotely located device such as a cellphone 196 (also a personal computer, etc.).

In a further embodiment, operation of the EV by a temporary operator can be monitored. For example, the EV may be being parked by a valet, driven by a service engineer during maintenance of the EV, etc. A profile 170S can be configured to be active while the EV is being operated by the temporary driver to monitor (e.g., by vehicle operation component 166) whether the temporary driver is driving in a manner that unnecessarily degrades the modules 111A-n, and the owner of the EV can take over control of the EV if needed (e.g., via remote device 196 and vehicle operation component 166).

In an embodiment, the EV can be a rental vehicle and a profile 170F is created for the rental driver. Operation of the EV can be monitored during the rental period (e.g., by the vehicle operation component 166, and the profile 170F is updated accordingly with operational data 167A-n, etc. Based on how the driver operates the EV, the profile 170F can be updated to record if any alarms 177A-n were generated and whether the driver complied with the one or more recommended corrective operations 168A-n presented on the HMI 190. Further, the degradation component 163 can determine the amount of unnecessary degradation of modules 111A-n that occurred during the rental period by the driver's operation, and further determine a financial cost of the unnecessary degradation. In view of the alarms 177A-n and compliance with the corrective operations 168A-n, a rental charge for the EV can be adjusted to take into account the cost of unnecessary degradation of the modules 111A-n.

In an embodiment, a schedule component 182 can provide an indication of when one or more modules 111A-n should be switched out. The AI component 180 can be configured to perform a cost/benefit analysis of the cost of replacing the module in consideration of such factors as the cost of operating the EV with the depleted module(s), Wherein the cost can include the degree of degradation caused to other modules as a function of maintaining operation of the EV with the degraded module(s) of concern. In another aspect, the owner may be planning a trip, which the driver submits to the VCU 160 (e.g., via screens 191A-n presented on the HMI 190). The VCU 160 and associated components can review the planned journey and, if needed, recommend whether one or more modules 111A-n should be replaced prior to the journey commencing. In an alternative embodiment, one or more modules 111A-n may degrade at an unforeseen rate (e.g., failure of an internal component such as an anode perishing in a module). This may occur during a journey, e.g., cross country. The route component 172, e.g., in conjunction with the schedule component 182, can determine which auto dealers, garages, and the like, are on (or sufficiently near) the proposed route, and present to the driver one or more options to have the module replaced. Selection of a dealer can involve such parameters as what is anticipated replacement time?, does the dealer have a replacement module?, does the replacement have to be ordered . . . if so, what is the delivery time? The schedule component 182 can be utilized to schedule the replacement.

In another embodiment, as new modules 111A-n and technologies are developed (e.g., due to advancements in materials science), the AI component 180 can perform a cost/benefit analysis to determine whether it is worth replacing an old technology module with a newer technology module. The newer technology module may utilize more efficient technology/materials improving operation/efficiency, e.g., requires fewer recharge operations, EV can be driven further between charges, module has a wider operating temperature range for optimal temperature of use, faster charging, more efficient charging, newer materials have a higher charge to weight ratio, etc. An old technology module may require more energy (e.g., provided by the CS 116) to compensate for the effect of degradation versus the cost of replacing the old technology module. In an embodiment, the AI component 180 can utilize the routing data 173A-n to determine the operational history of the EV and determine whether a newer technology module would improve the efficiency and/or reduce module degradation in view of the operational history.

The degradation component 163 can control operation of the EV as a function of the operational load, e.g., energy demand on modules 111A-n and 113A-n by various vehicle components 142A-n. Under a condition of low operational load, e.g., driving along a flat road at a temperature approximating $t_{opp}$, the degradation component 163 can switch battery operation to the degraded modules, e.g., a first subset of modules in modules 111A-n, wherein the first subset of modules have a degraded condition. Under a condition of high operational load, e.g., driving up hill, the degradation component 163 can select that all of the modules 111A-n be utilized, e.g., to power the motor 145, however, once the operational load is reduced (e.g., the EV is travelling downhill) the degradation component 163 can once again select that only the degraded modules (e.g., the first subset of modules in the modules 111A-n) provide power. As previously mentioned, the respective operating conditions of the EV can be a function of weather conditions, e.g., seasonal use whereby summer operation has potential to cause one or modules to have an operating temperature above the optimal operating temperature range, winter use has potential to cause one or more modules to have an operating temperature below the optimal temperature range, where, as previously mentioned, degradation can be exacerbated the further the temperatures are from the optimal operating temperature. Accordingly, it may require all of the modules to be utilized under such conditions.

In an embodiment, the EV can be configured to operate autonomously to prevent unnecessary degradation of the modules 111A-n and 113A-n. For example, the vehicle operation component 166 can make a determination that an alternative parking location would result in less module degradation than a current parking location. Any combination of exterior temperature measurement, weather information received from UE 196, battery data 138, thermal data from sensors 130A-n, and the like can be utilized. Based on determining that the current location is deleterious to the SOH of the modules, the vehicle operation component 166 can be configured to generate a request to the route component 172 for a less damaging, alternative location to be identified. The route component 172 can be configured to review onboard information (e.g., routes 173A-n, parking location information) as well as request information from external sources 196 (e.g., street view images, parking location information regarding covered, heated, air conditioned, hours, pricing, availability, etc.) and identify a parking location causing less module degradation than the current location. The vehicle operation component 166 can be further configured to activate the starting system 149 and autonomously drive the EV, and relocate the EV to alternative parking location. The vehicle operation component 166 can be further configured to transmit a signal 189 to UE 196 informing the operator of the new location of the EV. In an alternative embodiment, the vehicle operation component 166 can be configured to transmit a signal 189 to UE 196 informing the operator that the EV intends to relocate to the alternative parking location and does so upon receiving a signal 189 indicating approval from the operator for the EV to autonomously relocate, otherwise the EV remains at the current location. In a further embodiment, while the operator is operating the EV, the vehicle operation component 166 can identify (e.g., in conjunction with route component 172) a parking location that does not cause unnecessary degradation of the modules and presents the location, and route to it, on the HMI 190. The operator can select the proposed parking location and the route updated with the proposed parking location as the route destination.

Methodologies

FIGS. 9-15 illustrate example, non-limiting methodologies relating to mitigating degradation of one or more modules in a battery, wherein the battery is utilized in an EV. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement the methodologies described herein. The various methodologies presented herein can be applicable to at least the various embodiments presented herein, e.g., as discussed with at least reference to FIGS. 1-9.

Figure 9:
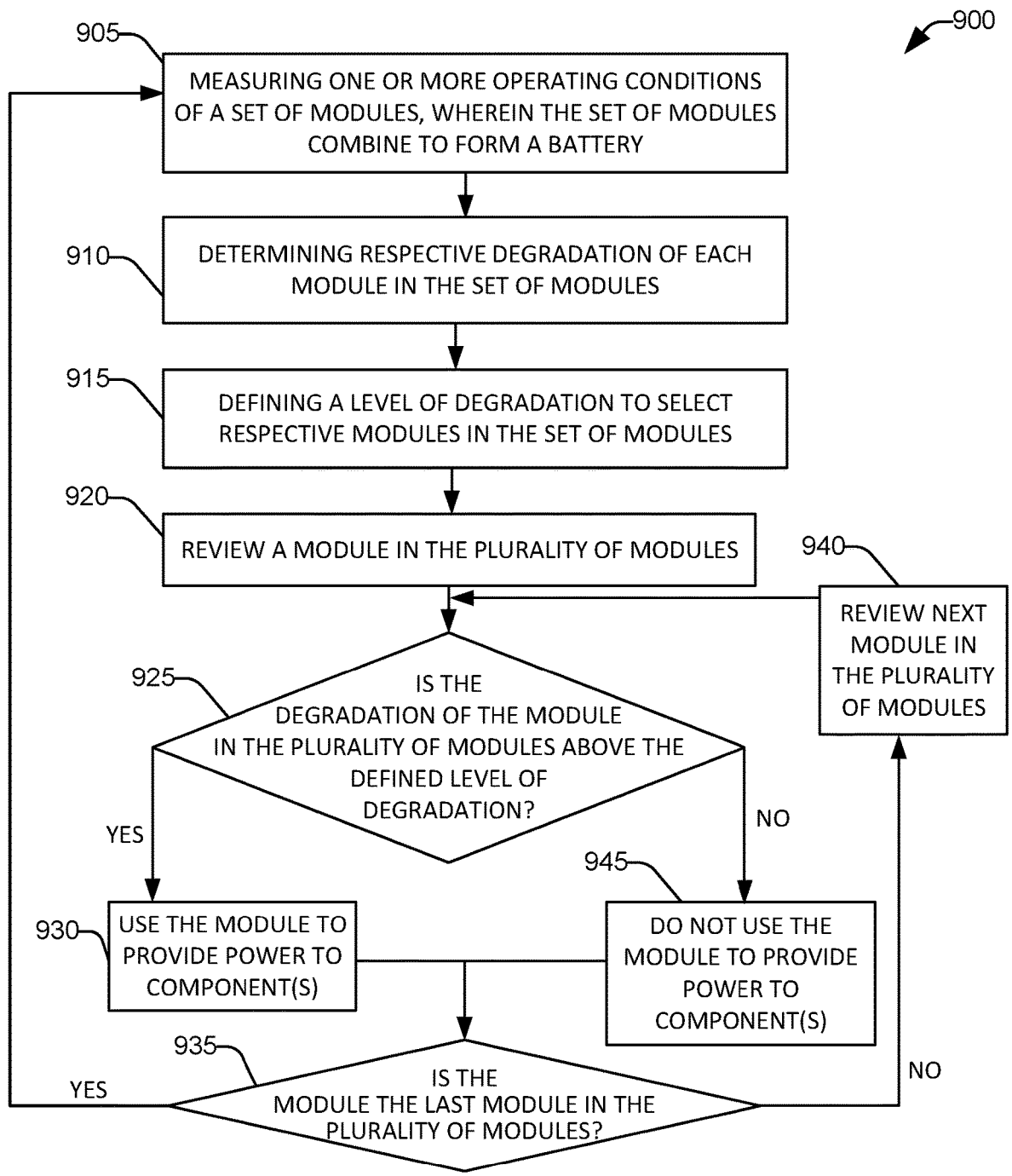
FIG. 9 is a flow diagram showing example operations related to selecting modules to power EV components to prevent degradation of one or more modules combined to form a battery onboard the EV, in accordance with various aspects and implementations of the subject disclosure.

FIG. 9 illustrates a flow diagram for a computer-implemented methodology 900 for minimizing degradation of battery modules (e.g., modules 111A-n) located on an EV (e.g., EV 101).

At 905, the computer-implemented method 900 can comprise measuring one or more operating conditions of one or more modules located in a battery. The operating conditions can pertain to any measurable parameter such as voltage, current, duration of operation, thermal profile, thermal cycling, charging, discharging, recharging, etc., as previously mentioned.

At 910, based upon the measurements, an operational state/operational condition (e.g., SOH, SOC, DOD, and the like) of each module in the one or more modules can be determined. Based upon the operational state, it is possible to determine a degree of degradation (e.g., by degradation component 163) that the respective module has undergone during its operational lifetime.

At 915, based upon the respective operational state and respective degradation of the one or more modules, a level of degradation (e.g., based upon a threshold 165A-n) for the system can be determined/defined. For example, a level of 75% of operational condition (or operational capacity) can be defined, wherein any modules that have an operational condition of less than 75%, are deemed to be in a degraded operational state, and those modules having an operational condition of 75% or higher are deemed to be in a good, non-degraded operational state.

At 920, the operational condition of a module in the group of modules can be assessed, wherein the operational condition can also be referred to as a state of degradation.

At 925, the operational condition of the module being reviewed is compared to the determined level of degradation.

At 930, in the event of the operational condition of the module is "YES" worse than the defined operational condition, the module is deemed to be in a degraded operational condition and the module is selected to be utilized to provide power to one or more components in the EV. For example, the module can be connected to an electrical circuit configured to provide power to the one or more components in the EV, wherein each respective module is individually connected to the electrical circuit by a switchable connector (as previously described). In the event of the module is assigned to continue to be utilized to provide electrical power, the switchable connector remains in a closed position, connecting the internal electrical circuit of the module to the electrical circuit.

At 935, a determination can be made whether the module just reviewed (e.g., at 920-935) is the last module in the one or more modules. In the event that YES this is the last module in the group of modules, the operations can return to 605 for the operating conditions to be reassessed. It is to be appreciated that when returning to 905, the number of modules having their respective operational condition assessed may be less than the total number of modules available. For example, the number of modules may be the modules that have been determined to be in a degraded state of operation and are being utilized to power the one or more components.

Returning to 925, in the event of the operational condition of the module is better than the defined operational condition (a response of "NO" the module does not have a level of degradation above the defined degradation level) the module is deemed to be in a better-than defined level of degradation and the operations advance to 945.

At 945, the module is assigned to not provide power to one or more components located on the EV. The module can be disconnected from the electrical circuit by changing the position of the switchable connector to an open position, as previously described. The operations can advance to 935, as previously described.

It an example, is to be appreciated that the defined operational condition can be based upon an average, mean, etc., condition of the group of modules. In another example, the defined operational condition can be a value applied to the group of modules, e.g., for a given period of operation, an operational condition OC is considered to be in effect, accordingly, the operational condition of the group of modules can be assessed against that effective operational condition.

Figure 10:
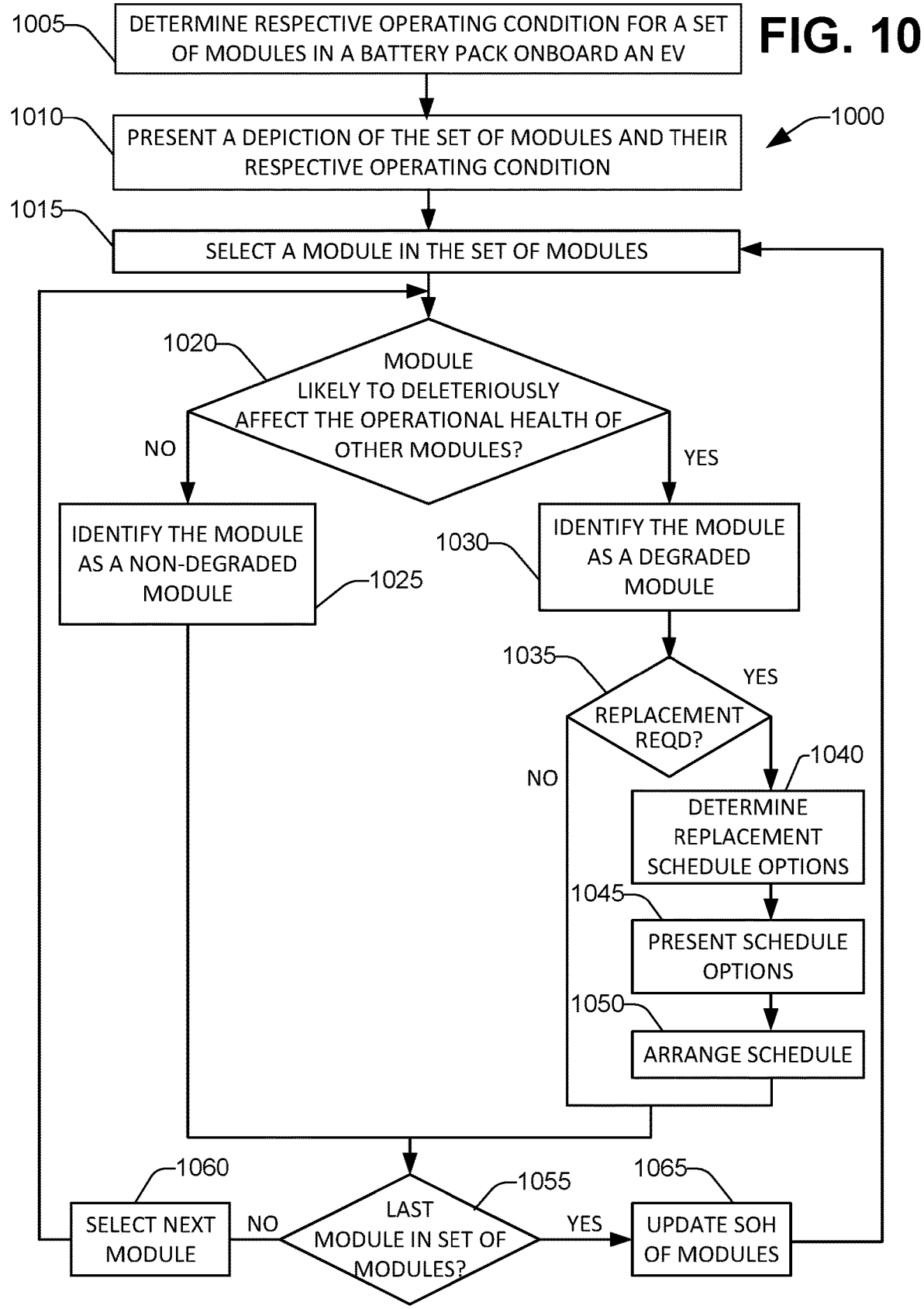
FIG. 10 is a flow diagram showing example operations related to identifying and replacing modules to prevent degradation of one or more modules combined to form a battery onboard an EV, in accordance with various aspects and implementations of the subject disclosure.

FIG. 10 illustrates a flow diagram for a computer-implemented methodology 1000 for minimizing degradation of battery modules (e.g., modules 111A-n, 113A-n) located on an EV (e.g., EV 101).

At 1005, for each module (e.g., modules 111A-n, 113A-n) in a battery pack located on an EV, the respective operating condition can be determined. As previously described, the operating condition can be SOC, SOH, operational lifetime, temperature, etc.

At 1010, the battery pack can be depicted (e.g., on a screen 191A-n on HMI 190), wherein the respective location of each module can be shown and the operating condition(s). One or more operating conditions can be presented for each module, with various methods for interacting with the screen to present the desired operating condition information.

At 1015, a first module in the set of modules can be selected.

At 1020, a determination can be made for the selected module, whether the operational condition of the selected module would negatively affect the operational health of other modules in the battery pack. Owing to how the individual modules are electrically connected to form a battery, an operating condition of a module can affect the operating condition of the neighboring modules and potentially lessen the operational lifetime of the other modules. Any suitable measure can be utilized, e.g., a threshold (e.g., thresholds 165A-n) determined by one or more components located on the EV (e.g., AI component 180, degradation component 163) based on one or more operating conditions of the set of modules, a threshold value entered by the EV operator, a threshold received from a remote device (e.g., provided by the EV manufacturer, the module manufacturer, other third party), and the like.

At 1025, in response to determining that the operating condition of the module would not deleteriously affect the other modules (e.g., the module has an acceptable SOC), the module can be indicated on the screen as being a non-degraded module. As mentioned elsewhere, given the healthy operational state of the module and to prevent unnecessary degradation of it, the module may be de-selected when modules are being identified to provide power to various onboard components in an attempt to extend the operational lifetime of the module. The method can proceed to 1055.

At 1055, a determination can be made as to whether the module being reviewed is the last module in the set of modules to be reviewed.

At 1060, in response to NO, this is not the last module, the next module can be selected and the method can return to 1020 for a determination to be made as to whether the operational condition of the next module deleteriously affects the operational health of other modules in the battery pack.

Returning to 1020, in the event of a determination that YES it is possible that the operational health of the module can deleteriously affect the operational condition of another module in the battery pack, the method can advance to 1030, where the module can be identified as degraded (e.g., one or more of the operational parameters of the module are below a defined threshold, level, and the like).

At 1035, a determination can be made regarding whether the module has an operating condition so degraded that the module needs to be replaced, or, while the operating condition is determined to be degraded, it does not warrant replacement of the module at the moment. In response to determining that, at the moment, NO, the module does not need to be replaced, the method can advance to 1055 for a determination as to whether the module is the last in the set of modules to be reviewed, as previously described.

Returning to 1035, in the event of a determination that YES the operating condition of the module is such that it should be replaced, the method can advance to 1040, where one or more replacement options can be determined (e.g., by schedule component 182, route component 172), e.g., service center has a replacement module, location of the service center, cost of replacement, time for replacement to occur, and the like.

At 1045, the respective options regarding replacing the module can be presented to the EV operator (e.g., on HMI 190), and the operator can enter a selection of the chosen option.

At 1050, the replacement of the module can be scheduled (e.g., by the schedule component 182) and the schedule details can be presented on the HMI 190 for the operator. The method can advance to 1055 for a determination as to whether the module is the last in the set of modules to be reviewed, as previously described.

Returning to 1055, in the event that YES the module currently being reviewed is the last of the modules in the set, the method can advance to 1065, where the operational health of the modules can be updated, with the method further returning to 1015 where the degradation and scheduling process can be repeated. It is to be noted that while FIG. 10 presents a sequential updating and review of the operating condition of the modules, any sequence of operations can be utilized, e.g., update the operational health of the modules as the respective measurements are received.

Figure 11:
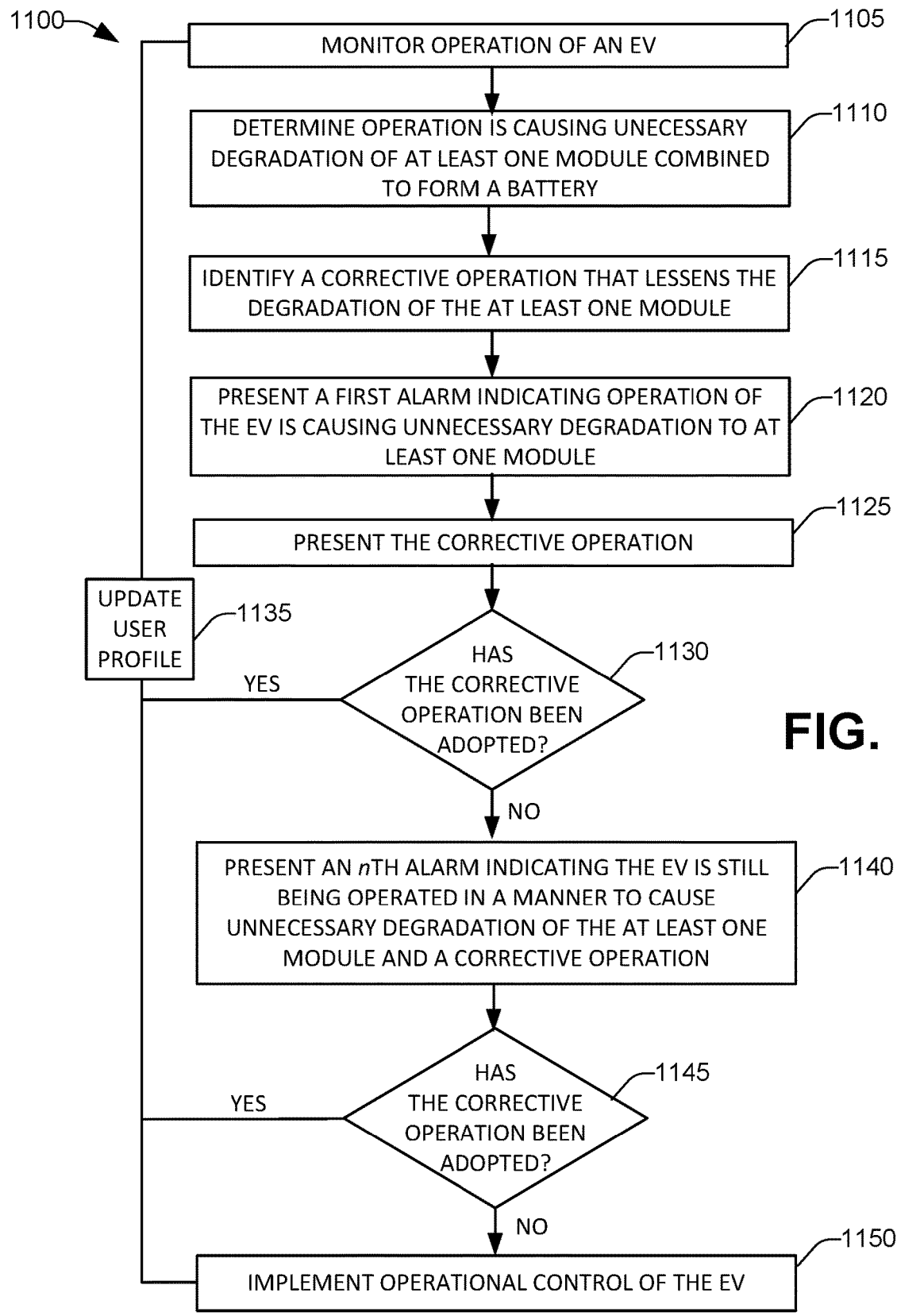
FIG. 11 is a flow diagram showing example operations related to determining and applying one or more corrective operations to prevent degradation of one or more modules combined to form a battery onboard an EV, in accordance with various aspects and implementations of the subject disclosure.

FIG. 11 illustrates a flow diagram for a computer-implemented methodology 1100 for minimizing degradation of battery modules (e.g., modules 111A-n, 113A-n) located on an EV (e.g., EV 101).

At 1105, current operation of an EV can be monitored by an onboard component (e.g., VCU 160), wherein current operation can include driving style (e.g., acceleration, braking), route being navigated, future route to be navigated, vehicle components being utilized (e.g., vehicle components 142A-n, air conditioner 148, RBS 146, and the like), temperature of individual battery modules, average temperature of modules in the battery pack, temperature external to the EV (e.g., weather conditions determined from a weather report, an onboard temperature sensor, and the like), etc.

At 1110, a determination can be made that the operation of the EV is causing unnecessary degradation in the operating condition of at least one module in a group of modules combined to form a battery pack, wherein the battery pack is onboard the EV. In an example scenario, a lower temperature threshold of 10° C./50° F. has been set for module operating temperature, and a higher temperature threshold of 30° C./86° F. has also been set, the current operating temperature of the module is determined to be at 36° C./97° F., which as previously described is a temperature that the module can operate but is higher than the optimal operating temperature of 25° C./77° F., and is a temperature at which degradation can occur, accordingly, the operating temperature can be qualified as poor.

At 1115, at least one corrective operation (e.g., corrective operations 168A-n) of the EV can be identified, wherein the at least one corrective operation is an alternative to the current operation of the EV and is determined to lessen degradation of the at least one module. The at least one alternative operation of the EV provides an option to the current operation, e.g., a different route that places less energy demand on the battery pack, a route with less traffic/congestion, a shaded route, and the like.

At 1120, a first alarm (e.g., alarm 177A) can be presented (e.g., on the HMI 190) indicating that current operation of the EV is causing unnecessary degradation at least one of the modules. As previously mentioned, the current operation can be driver activity (e.g., aggressive acceleration/braking), a route, weather, etc.

At 1125, the at least one corrective operation can be presented (e.g., on the HMI 190) to the operator, wherein presentment can be visual, audible, etc.

At 1130, after presentment of the corrective operation(s), the EV system (e.g., VCU 160) can monitor operation of the EV and a determination can be made as to whether the at least one corrective operation has been adopted by the operator. In an embodiment, the determination can be made after the operator has acknowledged the presentment of the at least one corrective operation. Alternatively, the operator may not choose to acknowledge the at least one corrective operation, hence, the control system (e.g., VCU 160) can wait a period of time before making the determination of whether the at least one corrective operation has been undertaken.

In response to a determination of YES the corrective operation(s) have been adopted, the method can flow to 1135, wherein the user profile (e.g., any of user profiles 170A-n) can be updated indicating that the EV was being operated in a manner to cause unnecessary module degradation, but the proposed corrective operation(s) were complied with. Methodology 1100 can return to 1105 for subsequent monitoring of operation of the EV with regard to module degradation.

In response to a determination of NO the corrective operation(s) has not been adopted, methodology 1100 can advance from 1130 to 1140, where a subsequent alarm (e.g., alarm 177) can be presented (e.g., on HMI 190) indicating the EV is still being operated in a manner to cause unnecessary module degradation in conjunction with the corrective operation(s).

At 1145, similar to the first presentment of the corrective operation(s), after the nth presentment of the corrective operation(s), the EV system (e.g., VCU 160) can again monitor operation of the EV and determine whether the corrective operation(s) has been adopted by the operator.

In response to a determination of YES the corrective operation(s) have been adopted, the method can flow to 1135, wherein the user profile (e.g., any of user profiles 170A-n) can be updated indicating that the EV was being operated in a manner to cause unnecessary module degradation, but the proposed corrective operation(s) were complied with. Methodology 1100 can return to 1105 for subsequent monitoring of operation of the EV with regard to module degradation.

In response to a determination of NO the corrective operation(s) has not been adopted, methodology 1100 can advance from 1145 to 1150, wherein, in an attempt to reduce module degradation, the EV (e.g., via VCU 160) can take over control of one or more operations of the EV, e.g., turn off the air conditioning (e.g., air conditioner 148), select a first subset of modules to power one or more components onboard the EV, select a different route, etc. In an embodiment, as also described herein, the operator of the EV can prevent the EV from instituting a corrective action(s) by use of an override button or command.

Figure 12:
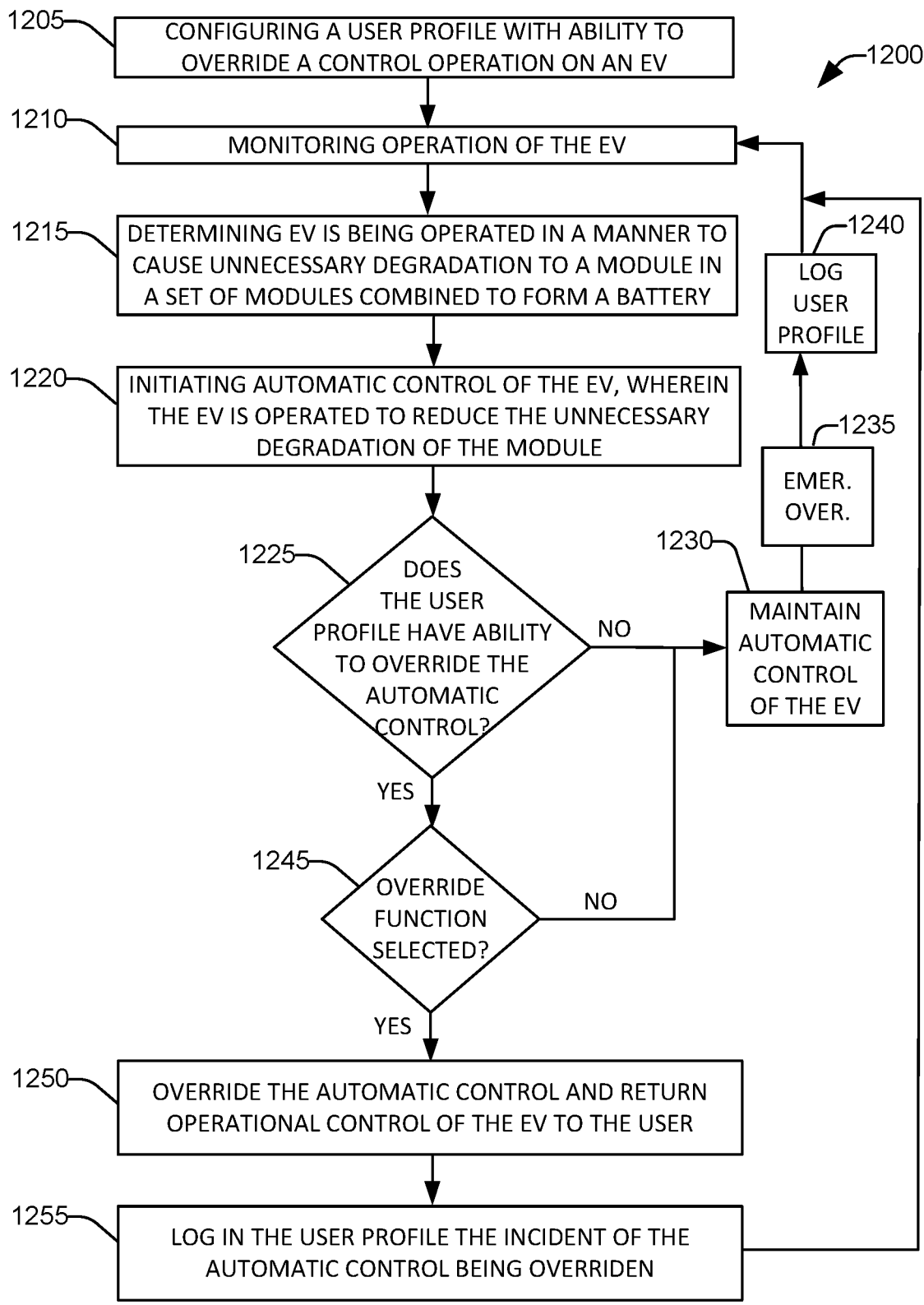
FIG. 12 is a flow diagram showing example operations related to overriding a corrective operation to prevent degradation of one or more modules combined to form a battery onboard an EV, in accordance with various aspects and implementations of the subject disclosure.

FIG. 12 illustrates a flow diagram for a computer-implemented methodology 1200 for minimizing degradation of battery modules (e.g., modules 111A-n, 113A-n) located on an EV (e.g., EV 101).

At 1205, one or more user profiles 170A-n can be configured with an override function, wherein the override function can be enacted to terminate a control operation imposed on an EV to mitigate unnecessary module degradation.

At 1210, operation of the EV can be monitored, e.g., by an onboard component (e.g., a vehicle operation component 166) or a remote component (e.g., remote component 196).

At 1215, a determination can be made that an EV is being operated in a manner to cause unnecessary degradation of one or more modules 111A-n and/or 113A-n.

At 1220, in response to determining the operation of the EV can be deleterious to the SOH of the one or more modules, operational control of the EV can be automatically initiated (e.g., by the vehicle operation component 166 utilizing the one or more corrective operations 168A-n).

At 1225, a determination can be made as to whether the operator of the EV (e.g., via user profiles 170A-n) has the ability to override the automatic operational control by the EV?, wherein the determination can be based upon the user profile of the operator being reviewed (e.g., by profile component 169) to establish whether the user profile has the override function available.

In response to determining that NO the user profile does not have the override function available, the method can advance to 1230, wherein automatic control of the EV is maintained.

Automatic operation of one or more functions by the EV (e.g., by the vehicle operation component 166 enforcing one or more corrective operations 168A-n) can be an unwanted predicament for the operator of the EV, and while their user profile may not have an override function, they may want to enforce an override, e.g., in an emergency where module degradation is a secondary concern compared to a health concern of the operator and/or a passenger. At 1235, an emergency override option (e.g., emergency override button 850 presented on the HMI 190) can be made available, whereupon selection, in a first example scenario, one or more corrective operations (e.g., any of corrective operations 168A-n) can be overridden (e.g., terminated). In a second example scenario, the EV can go into "emergency mode", wherein the EV operates autonomously with the operator giving an instruction, e.g., a destination (such as a hospital), which the EV navigates to with minimal regard for module degradation, but rather controls operation of one or more onboard components to ensure that the destination is reached (e.g., vehicle operation component 166 terminates operation of the air conditioner 148 to conserve energy to be directed to the motor 145).

Further, at 1240, the operator's user profile can be updated to indicate that operation of the EV by the operator generated a determination that the operator was operating the EV in a manner to cause unnecessary degradation of the EV. The method can return to 1210 for further operation of the EV to be monitored.

Returning to 1225, in response to YES the user profile does have the override feature available, at 1245 a determination can be made as to whether the override function has been selected. In response to a determination of NO the override function has not been selected, the method can proceed to 1230 as further described.

In response to a determination at 1245 that YES the override function has been selected, the method can advance to 1250, whereupon the automatic corrective operation initiated by the EV system (e.g., by the vehicle operation component 166 utilizing the one or more corrective operations 168A-n) can be terminated and operational control of the EV is returned to the operator.

At 1255, the operator activity regarding causing automated control of the EV to be initiated can be logged in the operator's user profile in conjunction with them overriding the corrective operation. The method can further advance to 1210 for continued monitoring of the operation of the EV.

Figure 13:
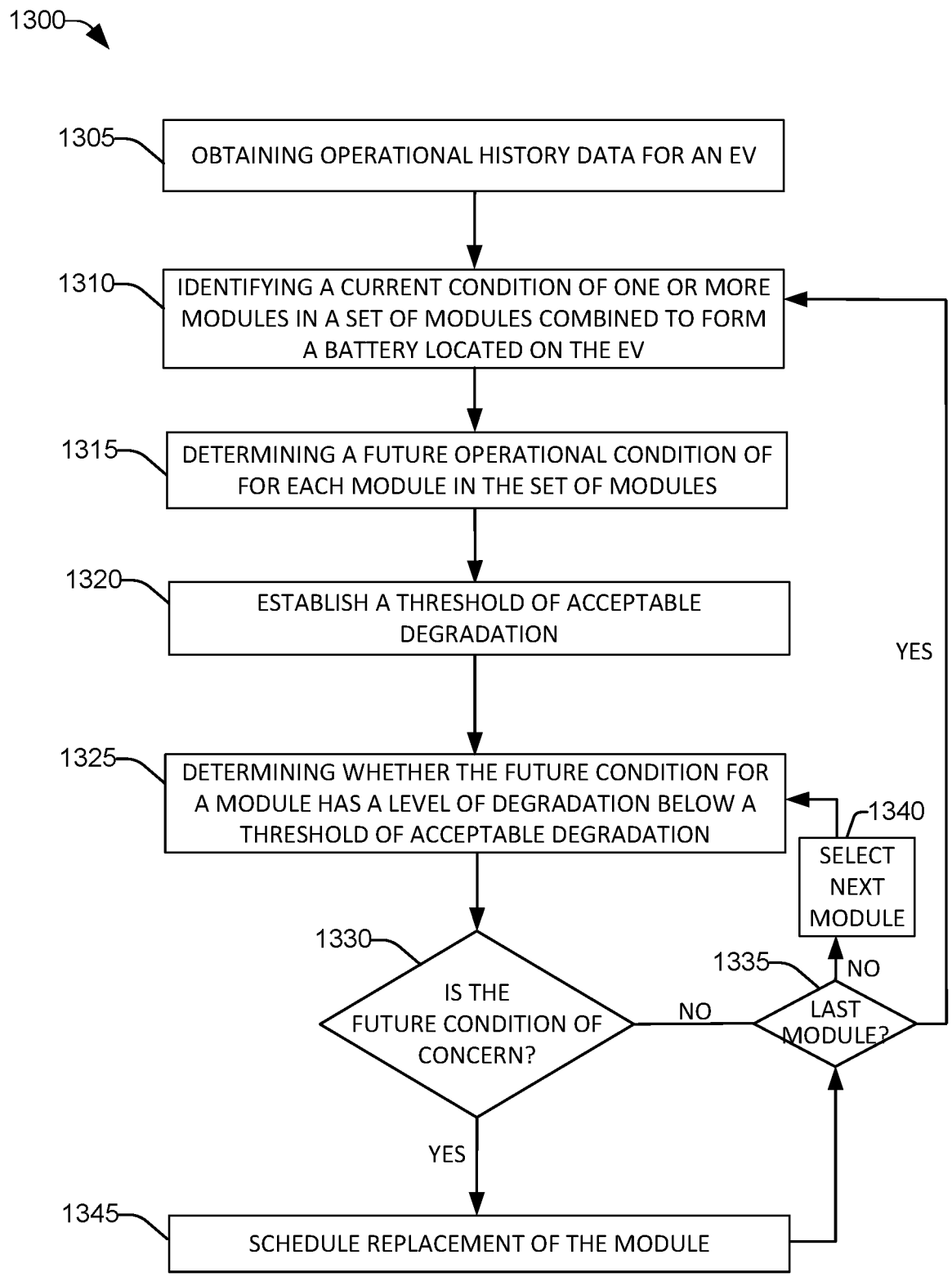
FIG. 13 is a flow diagram showing example operations related to determining a future condition of one or more modules in an EV battery to prevent degradation, in accordance with various aspects and implementations of the subject disclosure.

FIG. 13 illustrates a flow diagram for a computer-implemented methodology 1300 for minimizing future degradation of battery modules (e.g., modules 111A-n, 113A-n) located on an EV (e.g., EV 101).

At 1305, the operational history of the EV can be obtained (e.g., by vehicle operation component 166) from onboard components as well as remote components (e.g., sensor data 131A-n, battery data 138, system data 155, VCU data 161, external data 198, route data 173A-n, data generated by computational models 181A-n, corrective operations 168A-n, operational data 167A-n, data generated by degradation models 164A-n, user profiles 170A-n, 199A-n instructions, operational data 192, and the like). Further, the data can be retrieved from local devices (e.g., memory devices 135, 151, 184, etc.) as well as from remote devices, e.g., the cloud.

At 1310, the current condition of one or more modules in an onboard battery (e.g., modules 111A-n, 113A-n) can be determined (e.g., by BMS 115, degradation component 163, AI component 180, vehicle operation component 166, and the like), wherein the current condition can pertain to any parameter of interest, e.g., SOH, SOC, temperature, etc., as previously described.

At 1315, a future condition of the one or more modules in the onboard battery can be determined (e.g., by BMS 115, degradation component 163, AI component 180, vehicle operation component 166, and the like) based on various predictive models (e.g., degradation models 164A-n, computational models 181A-n) as well as the data obtained at 1305.

At 1320, a threshold (e.g., thresholds 165A-n) of acceptable degradation can be established, as previously described.

At 1325, the future condition determined for each module can be assessed with regard to the threshold.

At 1330, a determination can be made whether the future condition of the module is of concern.

In the event that the future condition of a module is assessed as NO, future condition is not of concern, the method can advance to 1335, whereupon a determination can be made whether the module currently being assessed is the last module in the set of modules?

At 1340, in response to a determination that the module is not the last module, the method can return to 1325 for the degradation condition of the next module in the set of modules to be assessed.

Returning to 1335, in response to a determination that the module currently being assessed is the last module in the set of modules requiring assessment, the method can return to 1310 for a further operational condition determination to be performed, as/when necessary.

Returning to 1330, in response to a determination that the operational state (e.g., degradation) of the module currently being assessed is of concern (e.g., below the threshold condition), the method can advance to 1345, where replacement of the module can be scheduled. The method can advance to 1335 to determine whether the module currently being assessed is the last module in the set of modules, as previously described.

Figure 14:
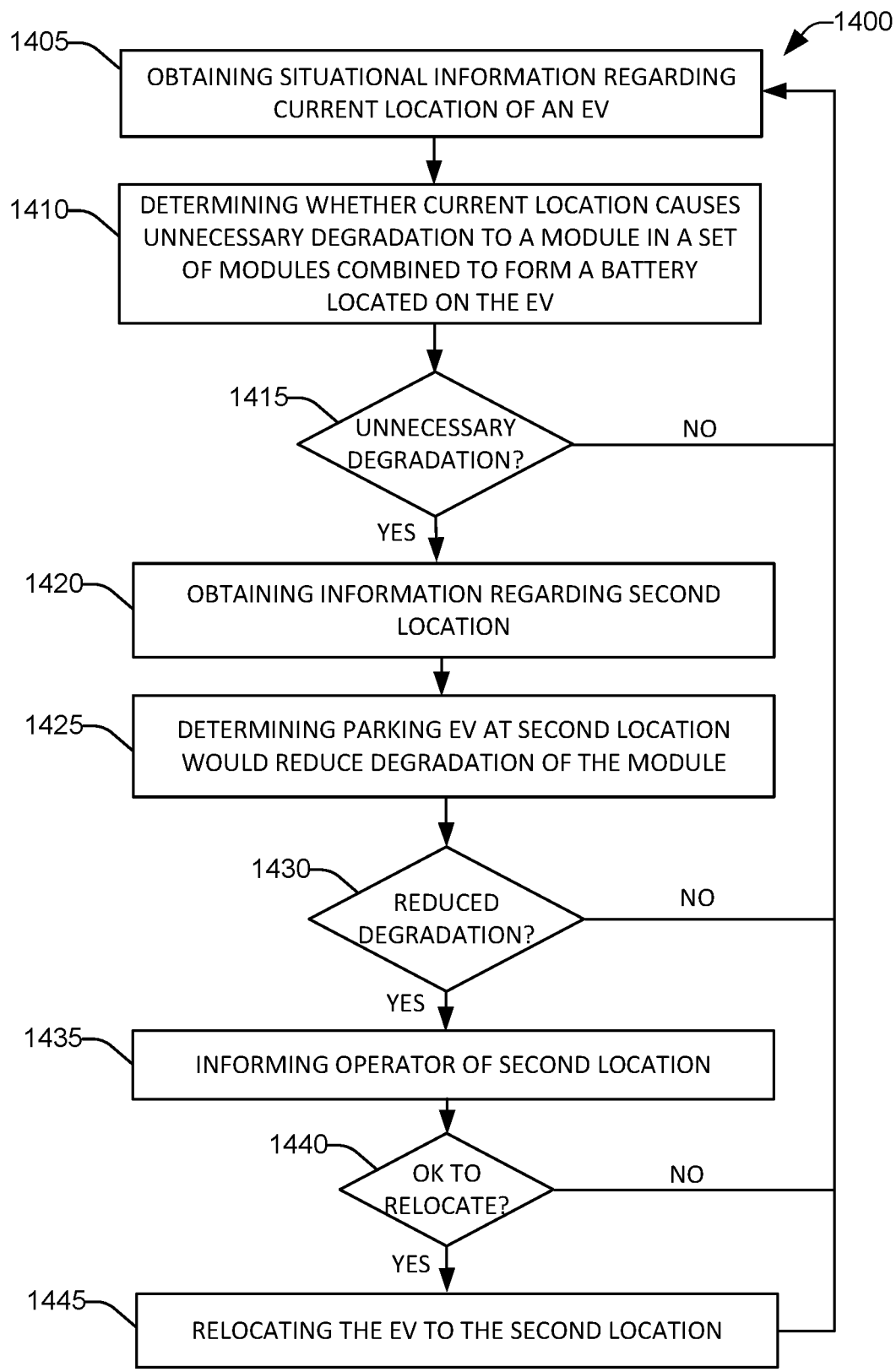
FIG. 14 is a flow diagram showing example operations related to autonomous parking of an EV to prevent degradation of one or more modules combined to form a battery onboard the EV, in accordance with various aspects and implementations of the subject disclosure.

FIG. 14 illustrates a flow diagram for a computer-implemented methodology 1400 for relocating an EV (e.g., EV 101) to minimize degradation of battery modules (e.g., modules 111A-n, 113A-n) located on the EV.

At 1405, data can be obtained regarding a current location of an EV (e.g., from route data 173A-n, external data such as exterior temperature of the EV, sensor data 131A-n such as thermal data, data 198 received from remote device 196 regarding weather conditions, and the like—the concepts in this methodology are directed towards thermal issues but can pertain to any parameter of concern).

At 1410, the obtained data can be reviewed to determine whether the current location of the EV, e.g., in a parking spot on a street with no overhead coverage, is causing or could cause unnecessary degradation of one or more of the battery modules. For example, the parking spot is hot (e.g., over 30 C or 86 C) or cold (e.g., less than 10 C or 50 F).

At 1415, in response to a determination that NO the current location of the EV is not causing unnecessary degradation of the one or more modules, the EV can remain at the current location, and the method can return to 1405 for further data collection regarding the location, e.g., a future condition can be assessed even though the current condition is acceptable.

At 1415, in response to a determination that YES the current location is causing, or could cause, unnecessary module degradation, the method can advance to 1420, wherein second data can be obtained regarding a second location. For example, second data can be obtained regarding whether there is covered parking in the area?, is there parking on a shaded street?, and the like (e.g., obtained from route data 173A-n, and the like).

At 1425, the second data can be reviewed to determine whether the second location would reduce the module degradation being experienced at the current location.

At 1430, in response to a determination that NO the second location would not improve (or substantially improve) the module degradation being experienced at the current location, the EV can remain at the current location, and the method can return to 1405 for further data collection regarding the location, e.g., a future condition of the current and second location can be assessed. In an embodiment, the determination of whether to move from the current location to another location can be a function of the energy required to re-locate the EV from the current location to the other location.

At 1430, in response to a determination that YES the second location can reduce the unnecessary module degradation, at 1435, the EV can send a signal (e.g., the vehicle operation component 166 can communicate with a device (e.g., UE 196) owned by the operator) that a different location can reduce module degradation.

At 1440, a determination can be made whether it is OK to relocate from the current location to the second location. The determination can be based upon receiving an instruction from the operator (e.g., the vehicle operation component 166 receives an instruction transmitted from the device (e.g., UE 196) owned by the operator).

In response to a received instruction that NO, the EV should remain at the current location, the method can return to 1405 for further data collection regarding the location, e.g., a future condition of the current and another location can be assessed.

In response to a received instruction that YES the EV can relocate to the second location, the method can advance to 1445, wherein the EV can autonomously relocate to the second location. The method can return to 1405 for further data collection regarding the now current location, e.g., a future condition of the current and another location can be assessed.

Figure 15:
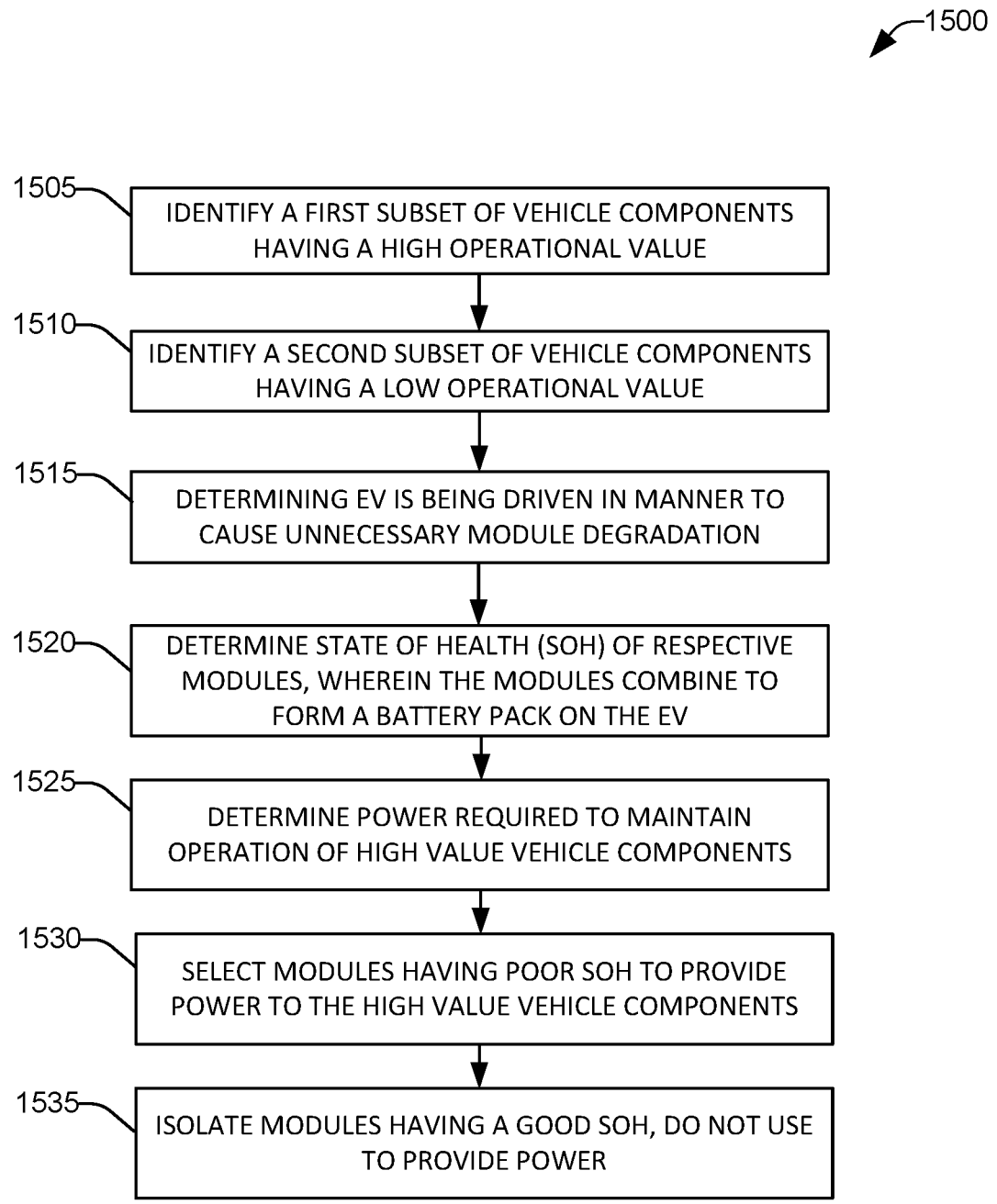
FIG. 15 is a flow diagram showing example operations related to utilizing one or more battery modules to power one or more components located on an EV to prevent degradation of the one or more modules, in accordance with various aspects and implementations of the subject disclosure.

FIG. 15 illustrates a flow diagram for a computer-implemented methodology 1500 to minimize degradation of battery modules (e.g., modules 111A-n, 113A-n) located on an EV.

At 1505, a first subset of the plethora of components, devices, etc., (e.g., vehicle components 142A-n) onboard an EV can be identified as having a high operational value. For example, depending upon a first scenario (e.g., the EV is in motion) the motor, brake system, acceleration system, vehicle control system (e.g., motor 145, braking system 146, acceleration system 147, VCU 160), can be identified as high value components. However, in a second scenario, (e.g., the EV is parked) the air conditioning (e.g., air conditioning unit 148) may be identified as a high value component as it is activated prior to a journey commencing to heat/cool the passenger area.

At 1510, a second subset of the plethora of components, etc., (e.g., vehicle components 142A-n) onboard the EV can be identified as having a low operational value. For example, in a third scenario (e.g., the EV is parked) the motor, brake system, and acceleration system (e.g., motor 145, braking system 146, acceleration system 147), can be identified as low value components.

At 1515, in an example scenario, the EV is being driven and a determination is made that the operation of the EV is causing unnecessary degradation of the battery modules. As mentioned, other example scenarios can occur, with the vehicle components identified as high/low based upon the particular scenario of operation.

At 1520, the respective SOH of each module in the battery are determined. In an embodiment, the SOH of each module can be assessed against a threshold (e.g., thresholds 165A-n), e.g., threshold exceeded, threshold met, threshold not exceeded. In another embodiment, the modules can be ranked based upon the respectively determined SOH, e.g., from poor SOH (e.g., SOH=70%) to good SOH (e.g., SOH=100%).

At 1525, an assessment can be made as to the amount of power is required to maintain operation of the vehicle components identified as having a high value during the example scenario.

At 1530, the various modules determined to have the lower SOH operational condition can be selected to provide power to the high value components.

At 1535, the various modules determined to have a high SOH operational condition can be isolated and not utilized to provide power to the high value components. Accordingly, rather than simply selecting a subset of modules to provision power to the high value components based upon a SOH threshold, the modules can be respectively ranked based upon SOH and the number of modules selected for use is a function of the energy requirements to keep the respective high value components operational while operation of the low value components is terminated.

Figure 16:
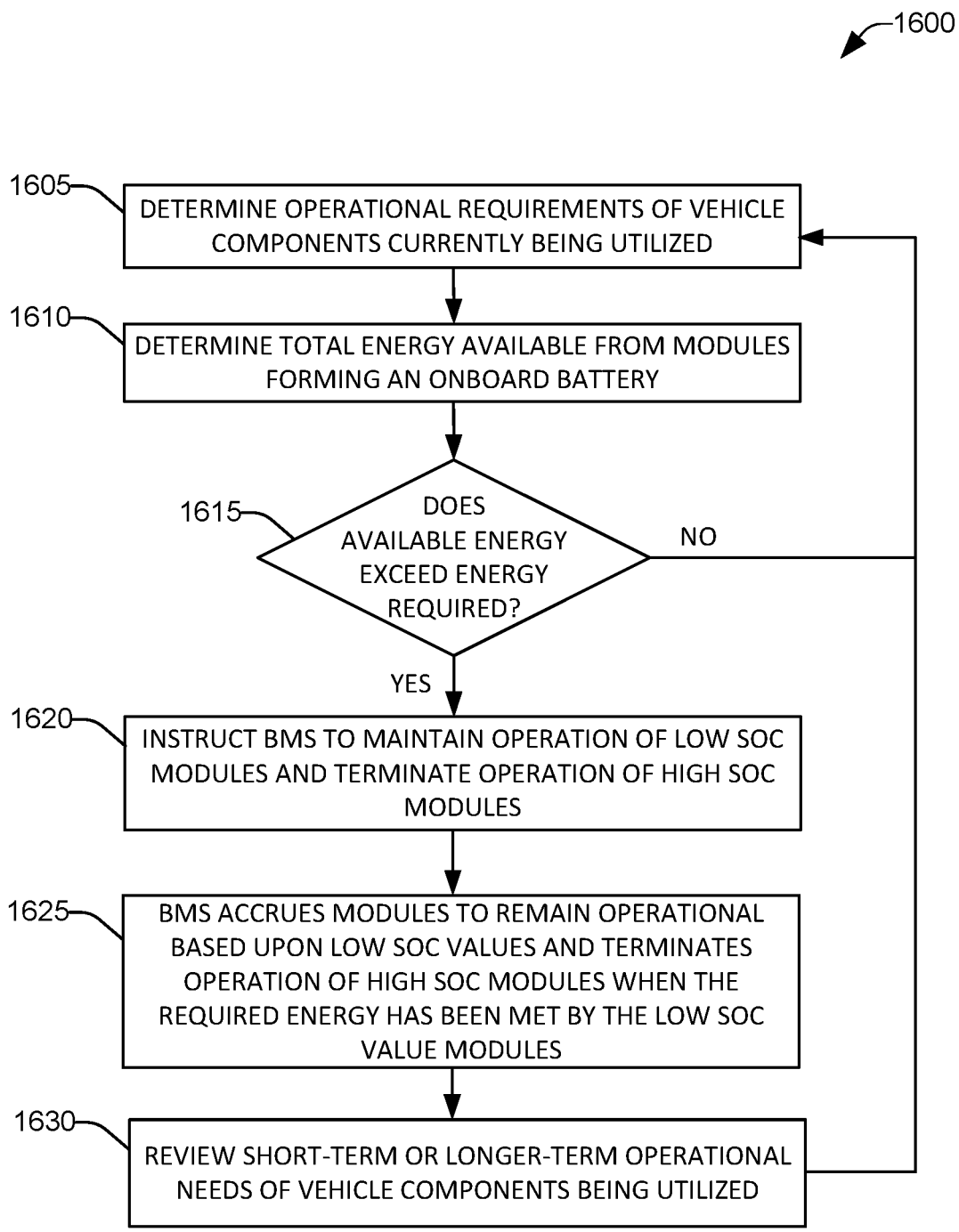
FIG. 16 is a flow diagram showing example operations related to utilizing one or more battery modules to power one or more components located on an EV to prevent degradation of the one or more modules, in accordance with various aspects and implementations of the subject disclosure.

FIG. 16 illustrates a flow diagram for a computer-implemented methodology 1500 to minimize degradation of battery modules (e.g., modules 111A-n, 113A-n) located on an EV. It is to be appreciated that while the example scenario in FIG. 16 is depicted as relating to SOC, the methodology is equally applicable to any operational parameter/measure, such as SOH, DOD, temperature, and the like, in accordance with the various embodiments presented herein.

At 1605, during operation of the EV, a vehicle control system (e.g., VCU 160) can assess the current operational requirements of various components (e.g., one or more components in the vehicle components 142A-n) currently operating on the EV along with the future operational requirements, e.g., to complete a journey. In an example scenario, the assessment can determine the energy requirement(s) for each component and then derive a total energy requirement for the currently operating components.

At 1610, an assessment can be made by an onboard battery management system (e.g., the BMS 115) regarding the total energy available from the onboard battery modules (e.g., modules 111A-n).

At 1615, a determination can be made by the VCU (e.g., by VCU 160) regarding whether the available energy matches or exceeds the energy required for operation of the components. As described herein, in a situation where the energy requirements exceed the available energy then operation of one or more vehicle components (low value components) can be terminated while operation of one or more vehicle components (high value components) is maintained.

At 1620, in response to a determination that YES the total energy available from the modules exceeds the current operational requirements, the VCU can instruct the BMS to terminate operation of modules having a high SOC and to power the various components using modules having a low SOC (wherein, SOC can be a measure of the operational health of a module, e.g., a module having a low SOC (e.g., approaching the 3.0V low voltage cutoff) is likely to be in a worse state of degradation than a module having a high SOC (e.g., approaching the 4.2V high voltage cutoff), particularly after the modules have been charged.

At 1625, the BMS can maintain operation of modules and terminate operation of others (e.g., via battery operation component 120, switches 230A-n). The BMS can accrue modules to remain connected (e.g., to circuit 220) based upon adding modules together to achieve the required operating power by maintaining operation of the module having the lowest SOC (e.g., closest to the 3.0V low voltage cutoff), the module having the next lowest SOC, etc., until the required amount of energy is achieved. The modules having the highest SOCs (e.g., closest to the 4.2V high voltage cutoff) can be disconnected from the circuit, so as to maintain their operational health and minimize the degradation effects from the modules having the low SOC.

At 1630, the method can return to 1605, wherein the current operating requirements can be reassessed. The term "current" is used to imply a short-term prediction of energy needs (e.g., by AI component 180), e.g., for the next minute, the next 5 minutes, the next 10 minutes, etc. Further, a longer-term prediction can be made (e.g., by the AI component 180) based upon knowledge of the route, e.g., road ascends, descends, as well as the weather, the driving style of the vehicle operator, traffic congestion, etc., and modules can be selected based upon the energy requirements of the longer-term usage. Further, while a current operating condition may require a large amount of energy (e.g., driving uphill) and all of the modules are connected to provide power, upon the next energy requirement assessment, the amount of energy may decrease (e.g., driving downhill, road is flat), and less modules are utilized.

Returning to 1615, in response to a determination that NO the available energy from the modules does not exceed the energy required by the vehicle components operating, the method can return to 1605 wherein the current operating requirements can be redetermined. However, as described elsewhere, to mitigate module degradation, operation of one or more currently operating vehicle components can be terminated so as to reduce the operational load upon the modules.

Example Applications

Figure 17:
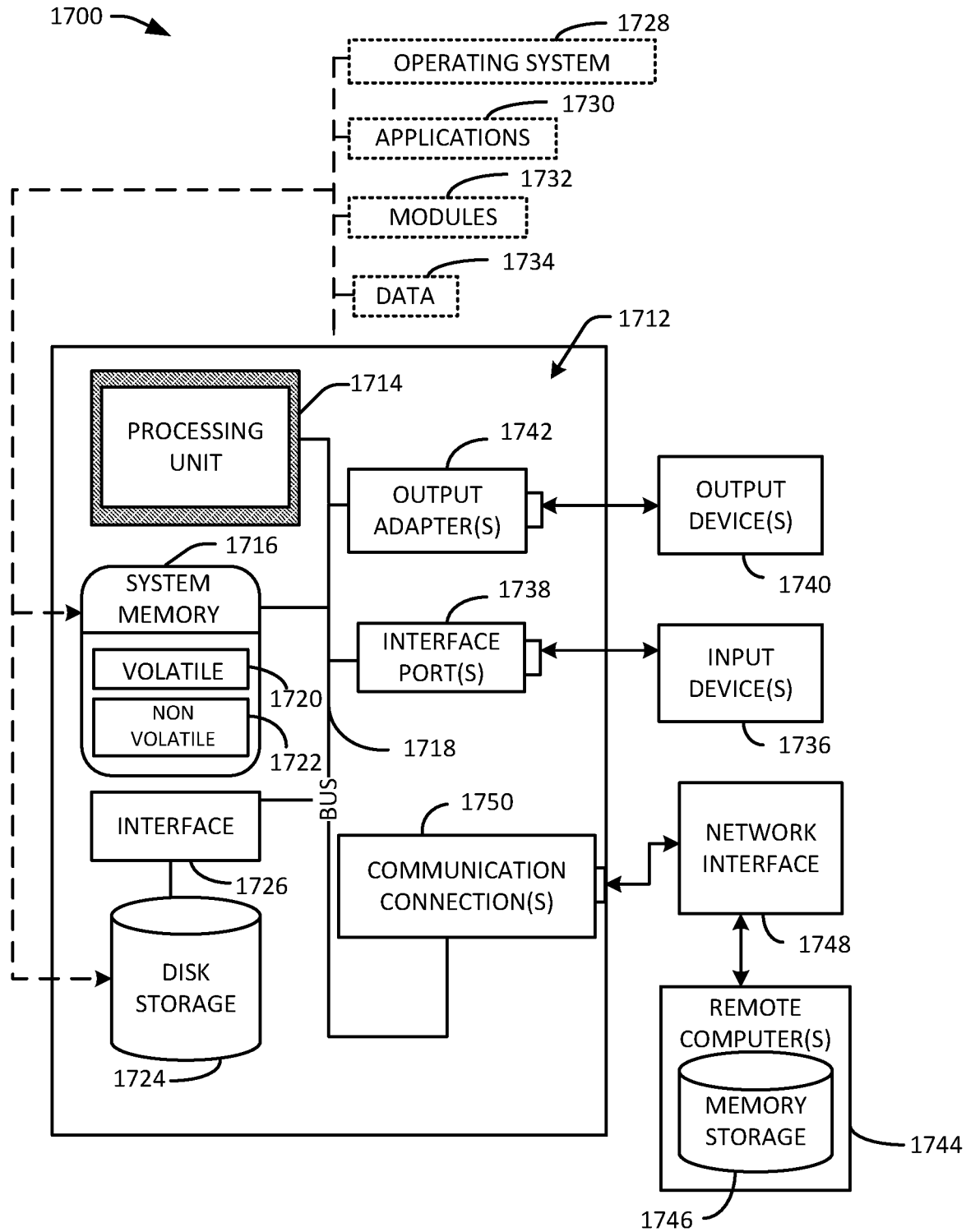
FIG. 17 depicts an example schematic block diagram of a computing environment with which the disclosed subject matter can interact/be implemented at least in part, in accordance with various aspects and implementations of the subject disclosure.
Figure 18:
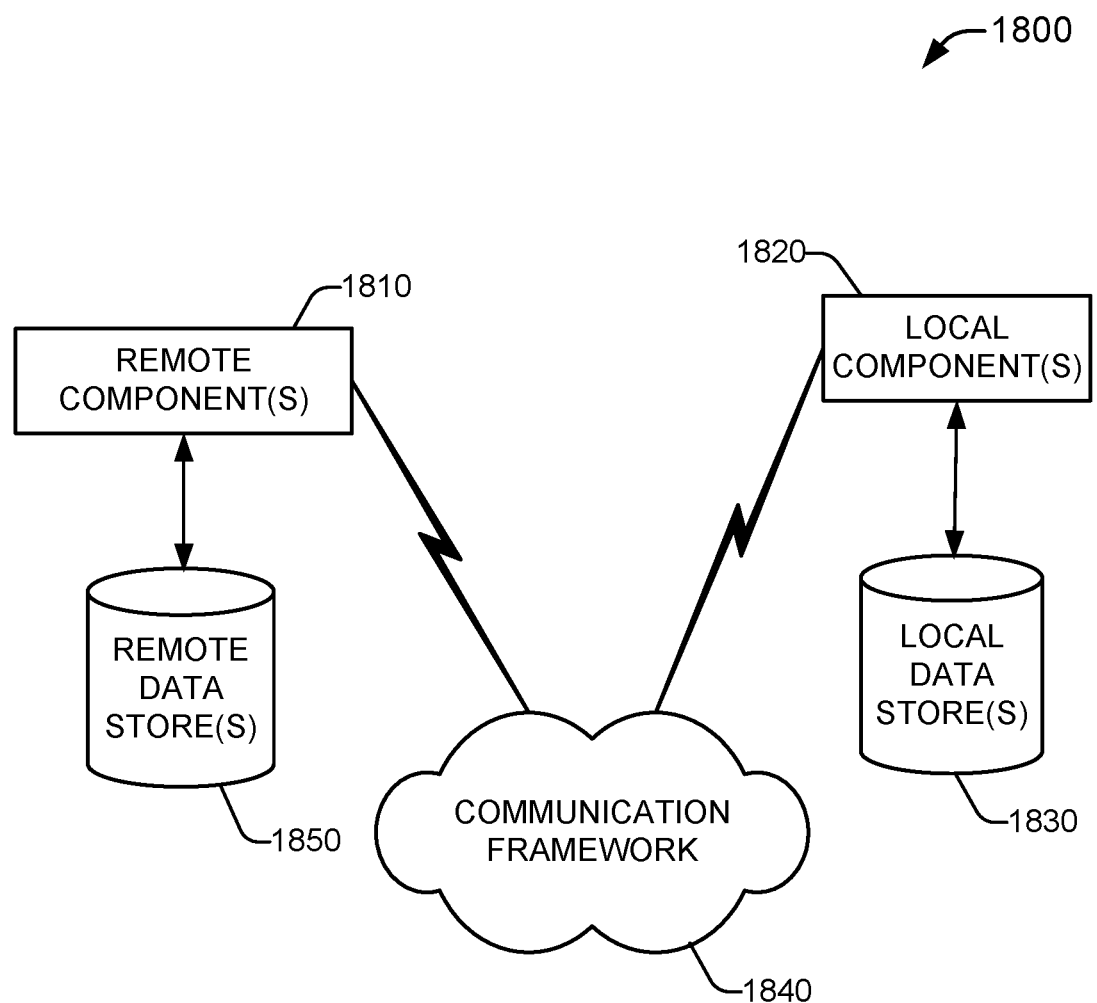
FIG. 18 is a block diagram representing an example computing environment into which aspects of the subject matter described herein may be incorporated.

Turning next to FIGS. 17 and 18, a detailed description is provided of additional context for the one or more embodiments described herein with FIGS. 1-16.

In order to provide a context for the various aspects of the disclosed subject matter, FIG. 17 as well as the following discussion are intended to provide a general description of a suitable environment in which the various aspects of the disclosed subject matter can be implemented. FIG. 17 illustrates a block diagram of an example, non-limiting operating environment in which one or more embodiments described herein can be facilitated. Repetitive description of like elements employed in other embodiments described herein is omitted for sake of brevity. With reference to FIG. 17, a suitable operating environment 1700 for implementing various aspects of this disclosure can also include a computer 1712. The computer 1712 can also include a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714. The system bus 1718 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), Small Computer Systems Interface (SCSI), a controller area network (CAN) bus, and a local interconnect network (LIN) bus. The system memory 1716 can also include volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1720 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1712 can also include removable/non-removable, volatile/non-volatile computer storage media. FIG. 17 illustrates, for example, a disk storage 1724. Disk storage 1724 can also include, but is not limited to, devices like a magnetic disk drive, floppy disk drive, tape drive, Jaz drive, Zip drive, LS-100 drive, flash memory card, or memory stick. The disk storage 1724 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used, such as interface 1726. FIG. 17 also depicts software that acts as an intermediary between users and the basic computer resources described in the suitable operating environment 1700. Such software can also include, for example, an operating system 1728. Operating system 1728, which can be stored on disk storage 1724, acts to control and allocate resources of the computer 1712. System applications 1730 take advantage of the management of resources by operating system 1728 through program modules 1732 and program data 1734, e.g., stored either in system memory 1716 or on disk storage 1724. It is to be appreciated that this disclosure can be implemented with various operating systems or combinations of operating systems. A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port can be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a means of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a computer, a server, a router, a network PC, a workstation, a microprocessor based appliance, a peer device or other common network node and the like, and typically can also include many or all of the elements described relative to computer 1712. For purposes of brevity, only a memory storage device 1746 is illustrated with remote computer(s) 1744. Remote computer(s) 1744 is logically connected to computer 1712 through a network interface 1748 and then physically connected via communication connection 1750. Network interface 1748 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1650 refers to the hardware/software employed to connect the network interface 1648 to the system bus 1618. While communication connection 1650 is shown for illustrative clarity inside computer 1612, it can also be external to computer 1612. The hardware/software for connection to the network interface 1648 can also include, for example purposes only, internal and external technologies such as, modems including regular telephone grade modems, cable modems and DSL modems, ISDN adapters, and Ethernet cards.

The illustrated embodiments described herein can be employed relative to distributed computing environments (e.g., cloud computing environments), such as described below with respect to FIG. 18, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment described below with reference to illustration 1800 of FIG. 18. For instance, one or more embodiments described herein and/or components thereof can employ such one or more resources to execute one or more: mathematical function, calculation and/or equation; computing and/or processing script; algorithm; model (e.g., artificial intelligence (AI) model, machine learning (ML) model, deep learning (DL) model, and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed. That is, the one or more embodiments described herein can be implemented in a local environment only, and/or a non-cloud-integrated distributed environment, for example.

A cloud computing environment can provide one or more of low coupling, modularity and/or semantic interoperability. At the heart of cloud computing is an infrastructure that includes a network of interconnected aspects.

Moreover, the non-limiting systems 100-1600 can be associated with and/or be included in cloud-based and/or partially-cloud-based system.

Referring now to details of one or more elements illustrated at FIG. 18, an illustrative cloud computing environment 1800 is depicted. FIG. 18 is a schematic block diagram of a computing environment 1800 with which the disclosed subject matter can interact. The system 1800 comprises one or more remote component(s) 1810. The remote component(s) 1810 can be hardware and/or software (e.g., threads, processes, computing devices). In some embodiments, remote component(s) 1810 can be a distributed computer system, connected to a local automatic scaling component and/or programs that use the resources of a distributed computer system, via communication framework 1840. Communication framework 1840 can comprise wired network devices, wireless network devices, mobile devices, wearable devices, radio access network devices, gateway devices, femtocell devices, servers, etc.

The system 1800 also comprises one or more local component(s) 1820. The local component(s) 1820 can be hardware and/or software (e.g., threads, processes, computing devices). In some embodiments, local component(s) 1820 can comprise an automatic scaling component and/or programs that communicate/use the remote resources 1810 and 1820, etc., connected to a remotely located distributed computing system via communication framework 1840.

One possible communication between a remote component(s) 1810 and a local component(s) 1820 can be in the form of a data packet adapted to be transmitted between two or more computer processes. Another possible communication between a remote component(s) 1810 and a local component(s) 1820 can be in the form of circuit-switched data adapted to be transmitted between two or more computer processes in radio time slots. The system 1800 comprises a communication framework 1840 that can be employed to facilitate communications between the remote component(s) 1810 and the local component(s) 1820, and can comprise an air interface, e.g., Uu interface of a UMTS network, via a long-term evolution (LTE) network, etc. Remote component(s) 1810 can be operably connected to one or more remote data store(s) 1850, such as a hard drive, solid state drive, SIM card, device memory, etc., that can be employed to store information on the remote component(s) 1810 side of communication framework 1840. Similarly, local component(s) 1820 can be operably connected to one or more local data store(s) 1830, that can be employed to store information on the local component(s) 1820 side of communication framework 1840.

The embodiments described herein can be directed to one or more of a system, a method, an apparatus, and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device, and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA), and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures, and/or the like that perform particular tasks and/or implement particular abstract data types. Moreover, the aforedescribed computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. However, one or more, if not all aspects of the one or more embodiments described herein can be practiced on stand-alone computers. In a distributed computing environment, program modules can be located in both local and remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes", "has", "possesses", and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

1. An electric vehicle (EV) system, comprising: a memory that stores computer executable components; and a processor that executes the computer executable components stored in the memory, wherein the computer executable components comprise: a sensor component configured to generate operational data for a module, wherein the module is electrically coupled to a plurality of modules in a battery pack; an output component configured to transmit the operational data; a vehicle operation component configured to: receive the operational data; and based on the operational data, determine an operating condition of the module.

2. The EV system of claim 1, wherein the operational data is transmitted from the output component to the vehicle operation component using wireless technology.

3. The EV system of any preceding claim, wherein the operational data is transmitted from the output component to the vehicle operation component via an electrical circuit.

4. The EV system of any preceding claim, wherein the operational data comprises at least one of temperature, state of charge, state of health, depth of discharge, current, impedance, capacitance, or voltage.

5. The EV system of any preceding claim, wherein the module is a user-replaceable module configured to be removed from the EV.

6. The EV system of any preceding claim, wherein the module can be replaced by roadside assistance.

7. The EV system of any preceding claim, further comprising a presentation component configured to present a schematic of the battery pack, wherein a location of the module within the battery pack is identified in the schematic.

8. The EV system of any preceding claim, further comprising a degradation component configured to determine whether a current operating condition of the EV is a condition that exacerbates battery degradation.

9. The EV system of any preceding claim, wherein the degradation component is further configured to, based on a determination that the current operating condition exacerbates battery degradation, select the module to provision power for one or more components located on the EV.

10. A computer-implemented method for mitigating degradation of battery modules in a battery pack located on an electric vehicle (EV) comprising: detecting an operating condition of a module, wherein the module is electrically coupled to at least one other module in a battery pack; transmitting the module operating condition; and determining, by a device configured to receive the operating condition, a state of charge of the module.

11. The computer-implemented method of claim 10, wherein the module operating condition is transmitted using wireless technology.

12. The computer-implemented method of any preceding claim, wherein the module operating condition is transmitted via an electrical circuit.

13. The computer-implemented method of any preceding claim, wherein the operating condition comprises at least one of temperature, state of charge, state of health, depth of discharge, current, impedance, capacitance, or voltage.

14. The computer-implemented method of any preceding claim, wherein the module is a user-replaceable module configured to be removed from the EV.

15. The computer-implemented method of any preceding claim, further comprising: presenting a schematic of the battery pack; and identifying, on the schematic, location of the module within the battery pack.

16. The computer-implemented method of any preceding claim, further comprising: determining whether a current operating condition of the EV is a condition that causes unnecessary battery degradation; and based on determining the current operating condition causes unnecessary battery degradation, selecting the module to provision power for one or more components located on the EV.

17. A computer program product comprising a computer readable storage medium having program instructions embodied therewith, the program instructions executable by a processor to cause the processor to: detect an operating condition of a module, wherein the module is electrically coupled to at least one other module in a battery pack located on an electric vehicle (EV); transmit the module operating condition; and determine, by a device configured to receive the operating condition, at least one of state of charge of the module, state of health of the module, or depth of discharge of the module.

18. The computer program product of any preceding claim, wherein the module operating condition is transmitted using at least one of wireless technology or electric circuit.

19. The computer program product of any preceding claim, wherein the program instructions are further executable by the processor to cause the processor to: present a schematic of the battery pack; and identify, on the schematic, location of the module within the battery pack.

20. The computer program product of any preceding claim, wherein the program instructions are further executable by the processor to cause the processor to: determine whether a current operating condition of the EV is a condition that exacerbates battery degradation; and based on a determination that the current operating condition exacerbates battery degradation, select the module to provision power for one or more components located on the EV.

What is claimed is:

1. A system, comprising:
a memory that stores computer executable components; and
a processor that executes at least one of the computer executable components that:
generates, via respective sensors of battery cells of a battery pack of an electric vehicle (EV), respective operational data for the battery cells;
predicts, based on the respective operational data, respective predicted rates of degradation of the battery cells;
based on the respective rates of degradation of the battery cells:
identifies a first subset of the battery cells that have respective rates of degradation that exceed a threshold rate of degradation, and
identifies a second subset of the battery cells that have respective rates of degradation that do not exceed the threshold rate of degradation;
employs the first subset of the battery cells to provision power to the EV; and
prevents the second subset of the battery cells from provisioning power to the EV.

2. The system of claim 1, wherein the at least one of the computer executable components further:
in response to receiving an override input from an operator of the EV, allows the second subset of the battery cells to provision power to the EV.

3. The system of claim 1, wherein the degradation of the battery cells comprise chemical degradation.

4. The system of claim 1, wherein the operational data comprises at least one of temperature, state of charge, state of health, depth of discharge, current, impedance, capacitance, or voltage.

5. The system of claim 1, wherein the battery cells are respectively user-replaceable.

6. The system of claim 1, wherein the degradation of the battery cells comprise physical degradation.

7. The system of claim 1, wherein the at least one of the computer executable components further:
presents a graphical display of the battery pack, wherein respective locations of one or more modules within the battery pack comprising the first subset of the battery cells is identified.

8. A computer-implemented method, comprising:
generating, by a system of an electric vehicle (EV), via respective sensors of battery cells of a battery pack of the EV, respective operational data for the battery cells;
predicting, by the system, based on the respective operational data, respective predicted rates of degradation of the battery cells;
based on the respective rates of degradation of the battery cells:
identifying, by the system, a first subset of the battery cells that have respective rates of degradation that exceed a threshold rate of degradation, and
identifying, by the system, a second subset of the battery cells that have respective rates of degradation that do not exceed the threshold rate of degradation;
employs the first subset of the battery cells to provision power to the EV; and
prevents the second subset of the battery cells from provisioning power to the EV.

9. The computer-implemented method of claim 8, further comprising:
in response to receiving an override input from an operator of the EV, allowing, by the system, the second subset of the battery cells to provision power to the EV.

10. The computer-implemented method of claim 8, wherein the degradation of the battery cells comprise chemical degradation.

11. The computer-implemented method of claim 8, wherein the operational data comprises at least one of temperature, state of charge, state of health, depth of discharge, current, impedance, capacitance, or voltage.

12. The computer-implemented method of claim 8, wherein the battery cells are respectively user-replaceable.

13. The computer-implemented method of claim 8, wherein the degradation of the battery cells comprise physical degradation.

14. The computer-implemented method of claim 8, further comprising:
presenting, by the system, a graphical display of the battery pack, wherein respective locations of one or more modules within the battery pack comprising the first subset of the battery cells is identified.

15. A non-transitory computer-readable medium having instructions stored thereon that, in response to execution, cause a system of an electric vehicle (EV) to perform operations comprising:
generating, via respective sensors of battery cells of a battery pack of the EV, respective operational data for the battery cells;
predicting, based on the respective operational data, respective predicted rates of degradation of the battery cells;
based on the respective rates of degradation of the battery cells:
identifying a first subset of the battery cells that have respective rates of degradation that exceed a threshold rate of degradation, and
identifying a second subset of the battery cells that have respective rates of degradation that do not exceed the threshold rate of degradation;
employs the first subset of the battery cells to provision power to the EV; and
prevents the second subset of the battery cells from provisioning power to the EV.

16. The non-transitory computer-readable medium of claim 15, further comprising:
in response to receiving an override input from an operator of the EV, allowing the second subset of the battery cells to provision power to the EV.

17. The non-transitory computer-readable medium of claim 15, wherein the degradation of the battery cells comprise chemical degradation.

18. The non-transitory computer-readable medium of claim 15, wherein the operational data comprises at least one of temperature, state of charge, state of health, depth of discharge, current, impedance, capacitance, or voltage.

19. The non-transitory computer-readable medium of claim 15, wherein the battery cells are respectively user-replaceable.

20. The non-transitory computer-readable medium of claim 15, further comprising:
presenting a graphical display of the battery pack, wherein respective locations of one or more modules within the battery pack comprising the first subset of the battery cells is identified.

* * * * *